(12) United States Patent
Nagashima et al.

(10) Patent No.: US 7,881,116 B2
(45) Date of Patent: Feb. 1, 2011

(54) NONVOLATILE SEMICONDUCTOR MEMORY CAPABLE OF TRIMMING AN INITIAL PROGRAM VOLTAGE FOR EACH WORD LINE

(75) Inventors: Hiroyuki Nagashima, Yokohama (JP); Yasuyuki Fukuda, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/719,550

(22) Filed: Mar. 8, 2010

(65) Prior Publication Data

US 2010/0165740 A1 Jul. 1, 2010

Related U.S. Application Data

(63) Continuation of application No. 11/626,143, filed on Jan. 23, 2007, now Pat. No. 7,688,632.

(30) Foreign Application Priority Data

Jan. 24, 2006 (JP) .............................. 2006-015187
Aug. 7, 2006 (JP) .............................. 2006-214203

(51) Int. Cl.
*G11C 16/12* (2006.01)
(52) U.S. Cl. .......................... 365/185.19; 365/185.17; 365/185.12; 365/185.11; 365/185.33
(58) Field of Classification Search ............ 365/185.17, 365/185.11, 185.12, 185.22, 185.33, 185.19, 365/185.18
See application file for complete search history.

(56) References Cited

U.S. PATENT DOCUMENTS

| 5,555,204 | A | 9/1996 | Endoh et al. |
| 6,175,521 | B1 | 1/2001 | Pascucci et al. |
| 6,529,410 | B1 | 3/2003 | Han et al. |
| 6,643,180 | B2 | 11/2003 | Ikehashi et al. |

(Continued)

FOREIGN PATENT DOCUMENTS

JP 7-169284 7/1995

(Continued)

OTHER PUBLICATIONS

G. J. Hemink et al., "Fast and Accurate Programming Method for Multi-level NAND EEPROMs," 1995 Symposium on VLSI Technology Digest of Technical Papers, 1995, pp. 129-130.

*Primary Examiner*—Andrew Q Tran
(74) *Attorney, Agent, or Firm*—Oblon, Spivak, McClelland, Maier & Neustadt, L.L.P.

(57) ABSTRACT

A nonvolatile semiconductor memory of the present invention includes a plurality of bit lines and word lines which are arranged to intersect each other; a memory cell array having a plurality of electrically-programmable memory cells arranged in a region in which the bit lines and the word lines intersect; a trimming circuit configured to obtain a parameter of an initial program voltage for each word line of the plurality of word lines; an initial Vpgm parameter register configured to receive the parameter of the initial program voltage from the trimming circuit and to store the parameter; and a control circuit configured to perform programming of data to the memory cell array based on the parameter of the initial program voltage stored in the initial Vpgm parameter register, the trimming circuit being arranged in a part of the control circuit.

14 Claims, 15 Drawing Sheets

U.S. PATENT DOCUMENTS

| | | |
|---|---|---|
| 6,819,596 B2 | 11/2004 | Ikehashi et al. |
| 6,831,859 B2 | 12/2004 | Hosono et al. |
| 7,079,437 B2 | 7/2006 | Hazama et al. |
| 7,394,307 B2 | 7/2008 | Negoro et al. |
| 7,688,632 B2 * | 3/2010 | Nagashima et al. .... 365/185.19 |

FOREIGN PATENT DOCUMENTS

| | | |
|---|---|---|
| JP | 2001-176290 | 6/2001 |
| JP | 2002-117699 | 4/2002 |
| JP | 2003-110034 | 4/2003 |
| JP | 2004-158053 | 6/2004 |

* cited by examiner

NONVOLATILE SEMICONDUCTOR MEMORY CAPABLE OF TRIMMING AN INITIAL PROGRAM VOLTAGE FOR EACH WORD LINE

CROSS-REFERENCE TO RELATED APPLICATIONS

This application is a continuation of and claims the benefit of priority under 35 U.S.C. §120 from U.S. Ser. No. 11/626,143 filed Jan. 23, 2007, and claims the benefit of priority under 35 U.S.C. §119 from Japanese Patent Applications No. 2006-015187 filed on Jan. 24, 2006 and Japanese Patent Applications No. 2006-214203 filed on Aug. 7, 2006, the entire contents of each of which are incorporated herein by reference.

BACKGROUND OF THE INVENTION

1. Field of the Invention

The present invention relates to a nonvolatile semiconductor memory and a nonvolatile memory system using the nonvolatile semiconductor.

2. Description of the Related Art

An electrically programmable EEPROM (Electrically Erasable Programmable Read Only Memory) is traditionally known as one of the semiconductor memory devices. In particular, a NAND cell type EEPROM (a NAND type flash memory) comprised of blocks (NAND cell blocks) which connect a plurality of memory cells MTr in series has been paid attention to as a memory in which high integration and larger capacity may be expected compared to other memories. The conventionally used data program-and-erase operations of the NAND cell type EEPROM are as follows.

The program operation of the NAND type flash memory is mainly performed in order from the memory cell MTr which is farthest from the bit line BL. At first, when a data program operation is initiated, 0V ("0" data program) or a power-supply voltage Vcc ("1" data program) is applied to the bit lines corresponding to the program data, and a power-supply voltage Vcc is applied to the selection bit line BL side selection gate line. In this case, when the bit line BL is 0V, in the connected selection NAND cell block, the channel region within the NAND cell block is set to 0V via the selection gate transistor. When the bit line BL is the power-supply voltage Vcc, in the selection NAND cell block which is connected to this bit line BL, the channel region within the NAND cell block is charged to [Vcc-Vtsg] (here, Vtsg is a threshold voltage of the selection gate transistor) via the selection gate transistor, and afterwards becomes a floating state.

Next, the control gate line of the selection memory cell within the selection NAND cell block is set to Vpgm (for instance, about 20V, i.e., high voltage for programming) from 0V, and the control gate line of the non-selection memory cell within the selection NAND cell block is set to Vmg (for instance, about 10V: intermediate voltage) from 0V.

Here, when the bit line BL is 0V, in the NAND cell block which is connected to this bit line BL, the channel region within the NAND cell block is set to 0V, a large potential difference (for instance, about 20V) occurs between the gate (=Vpgm potential) and the channel region (=0V) of the selection memory cell within the selection NAND cell block, and electron injection occurs in the floating gate from the channel region. Thus, the threshold of the selection memory cell is shifted in a positive direction. This state is known as data "0".

On the other hand, when the bit line BL is the power-supply voltage Vcc, in the selection NAND cell block which is connected to this bit line BL, because the channel region within the NAND cell block is in a floating state, the voltage of the control gate line increases (0V→Vpgm, Vmg) by the effects of capacity coupling between the control gate line and the channel region within the selection NAND cell block. Accompanied with this increase (step up) in voltage, the potential of the channel region is increased to Vmch (for instance, about 8V) from [Vcc-Vtsg], which maintains the control gate in a floating state. When this occurs, the potential difference between the gate (=Vpgm potential) and the channel region (=Vmch potential) of the selection memory cell within the selection NAND cell block is relatively small, about 12V and thus electron injection does not occur. Therefore, the threshold of the selection memory cell does not change and is maintained in a negative state. This state is known as data "1."

A data erase operation of the NAND type flash memory is performed on all the memory cells MTr at once within the selection NAND cell block. That is, all control gates within the selection NAND cell block are set to 0V, the bit line BL, the common source line SOURCE, the control gates in the non-selection NAND cell block and all the selection gates are set to a floating state, and a high voltage of about 20V, for instance, is applied to the p-type well (or the p-type substrate). Thereby, electrons of the floating gate are released into the p-type well (or the p-type substrate) in all the memory cells MTr in the selection NAND cell block, and the threshold voltage is shifted in a negative direction. Thus, in the NAND type flash memory, the data erase operation is performed in block units.

The data readout operation of the NAND type flash memory is performed by setting the control data of the selection memory cell to 0V and detecting whether or not current flows in the selection memory cell as a voltage (for instance, 5V) provided from stress at the time of the readout operation of the control gate and the selection gate of the non-selection memory cell.

However, the following problems have been identified in the conventional program method (See Japanese Laid Open Patent 07-169284 and G. J. Hemink et al., Symposium on VLSI Technology Digest of Technical Papers, 1995, pp. 129-130 for reference).

At the time of programming, the shape of a program pulse is preferred to be "an ideal trapezoid-shaped waveform", but it is difficult to install a program pulse generation circuit which generates "an ideal trapezoid waveform" within the same memory cell array. In the conventional program method, the pulse waveform is set to a "step-shaped waveform." Therefore, there was a problem in which programming efficiency deteriorated compared to the ideal trapezoid-shaped waveform.

In addition, while it is possible to change the shape of the program pulse to appear more similar to "the ideal trapezoid-shaped waveform" by making an interval of the program pulse of the step-shaped waveform smaller, there was, however, a problem in which the number of verify operations increases and as a consequence, program time and erase time increases.

SUMMARY OF THE INVENTION

A nonvolatile semiconductor memory related to one embodiment of the present invention includes a plurality of bit lines and word lines which are arranged to intersect each other, a memory cell array having a plurality of electrically-programmable memory cells arranged in a region in which said bit lines and said word lines intersect, a trimming circuit configured to obtain a parameter of an initial program voltage for each word line of said plurality of word lines, an initial Vpgm parameter register configured to receive said parameter of said initial program voltage from said trimming circuit and to store said parameter, and a control circuit configured to perform programming of data to said memory cell array based on said parameter of said initial program voltage stored in said initial Vpgm parameter register, said trimming circuit being arranged in a part of said control circuit.

In addition, a nonvolatile semiconductor memory according to one embodiment of the present invention includes a plurality of bit lines and word lines which are arranged to intersect each other, a memory cell array having a plurality of electrically-programmable memory cells arranged in a region in which said bit lines and said word lines intersect, a plurality of trimming circuits configured to obtain a parameter of an initial program voltage for each word line of said plurality of word lines, the number of said plurality of trimming circuits being the same as the number of world lines, a plurality of trimming shift registers configured to receive said parameter of said initial program voltage from said plurality of trimming circuits and to store said parameter, and a control circuit configured to perform programming of data to said memory cell array based on parameter of said initial program voltage stored in said plurality of trimming shift registers, wherein said plurality of trimming circuits is arranged in a part of said control circuit.

DETAILED DESCRIPTION OF THE INVENTION

Process for realizing the Present Invention

Figure 1:
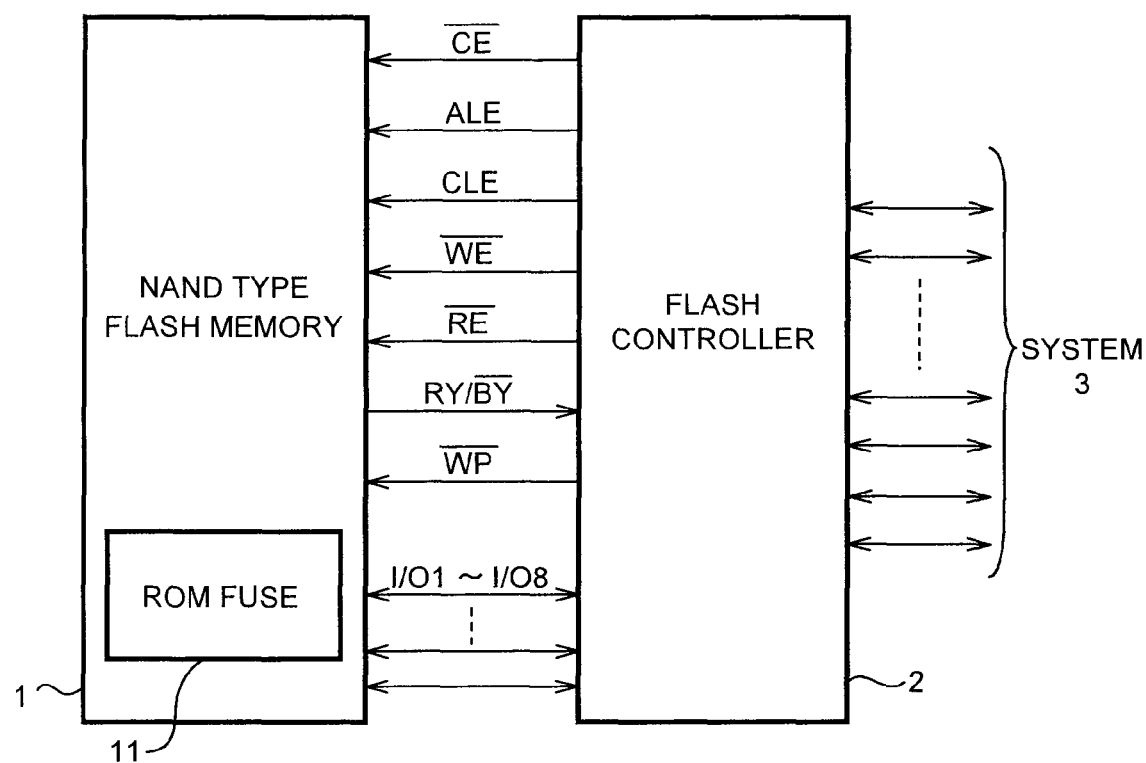
FIG. 1 is a block diagram showing one example configuration of the nonvolatile memory system according to Embodiment one of the nonvolatile semiconductor memory of the present invention.

Usually in a NAND type flash memory, the threshold after "0" data is programmed must be controlled between about 0V to about 4V. As a result, program verification is performed and only the memory cell MTr with a program shortage of "0" data is detected. Furthermore, reprogram data is set so that re-program should be performed only to the memory cell MTr with a program shortage of "0" data (per bit verification). The memory cell MTr with a program shortage of "0" data is detected by reading out the selection control data which, for example, is set to 0.5V (verification voltage) (verification readout). That is to say, if the threshold of a memory cell MTr is not equal to or more than 0.5V having a margin for 0V, electric current flows in the selection memory cell and thus it is detected as having a program shortage of "0" data.

Program time is optimized to individual memory cells MTr by programming data while repeating a program operation and a program verification and the threshold after "0" data has been program is controlled between about 0 V and about 4 V.

In the NAND type flash memory, because the program voltage Vpgm at the time of programming is set to be constant, the threshold change of the memory cell MTr is rapid at the initial period of programming, in which the amount of electrons in an electric charge accumulation layer is relatively few, whereas the threshold change of the memory cell MTr is slow in the latter period of programming, in which electron injection is performed and the amount of electrons in the electric charge accumulation layer is relatively large. Further, in the initial period of programming, an electric field which is applied to an interlayer insulation film in which a tunnel current flows is strong but weak in the latter period of programming.

As a result, if the program voltage Vpgm is raised to increase program speed, a maximum threshold after programming becomes high, the threshold distribution after programming becomes wide, the electric field applied to the interlayer insulation film in which the tunnel current flows, becomes strong and reliability deteriorates. Reversely, if Vpgm is lowered to narrow the threshold distribution width after programming, program speed becomes slow, in other words, the program voltage margin is narrow. In addition, as program or erase operations progress, efficiency deteriorates.

In addition, in terms of configuration, the NAND type flash memory differs in the characteristics in which each word line WL which is connected to a control gate of a plurality of memory cells MTr is programmed. In particular, program characteristics differ greatly between a word line WL which is adjacent to a selection gate and a word line WL near the center of the block. However, in the NAND type flash memory, there are no parameters of the initial program voltage Vpgm which is applied to each word line WL, and parameters which set a voltage shift value (offset value) from the initial program voltage Vpgm, are prepared for each word line WL. Here in the NAND type flash memory, the parameters which set the offset value may not be adjusted (trimmed) automatically within the NAND type flash memory. As a result, in the NAND type flash memory, an operation process must be performed using a CPU (Central Processing Unit) of an external tester or memory in order to determine an offset value for each word line WL, and thus test time becomes long.

Here, in the prior application JP2005-277,719A by the present applicant, in a series of program pulses, a programming method technology is disclosed in which it is possible to improve program speed and thus reduce program time by performing a program operation while gradually increasing the potential of a program pulse (also called threshold change pulse) by a step-up width Vpgm (this program method is hereinafter called "a step-up pulse method"). This step-up pulse method is a method in which programming is initially performed by applying a program pulse of a certain initial program voltage Vpgm, and then applying several programming pulses while increasing the initial program voltage Vpgm by a constant step-up voltage ($\Delta$Vpgm). In this way, the threshold distribution is controlled by gradually changing the threshold of the memory cell MTr. In this step-up pulse method, it is necessary to adjust (also known as trimming) the initial program voltage Vpgm so that programming time (or the number of programming loops) is completed within a predetermined time (or number of times). Here, the adjustment (trimming) of the initial program voltage Vpgm means, for instance, adjusting programming time to within a target time period or adjusting the number of programming loops to within a target number of times.

Figure 14A:
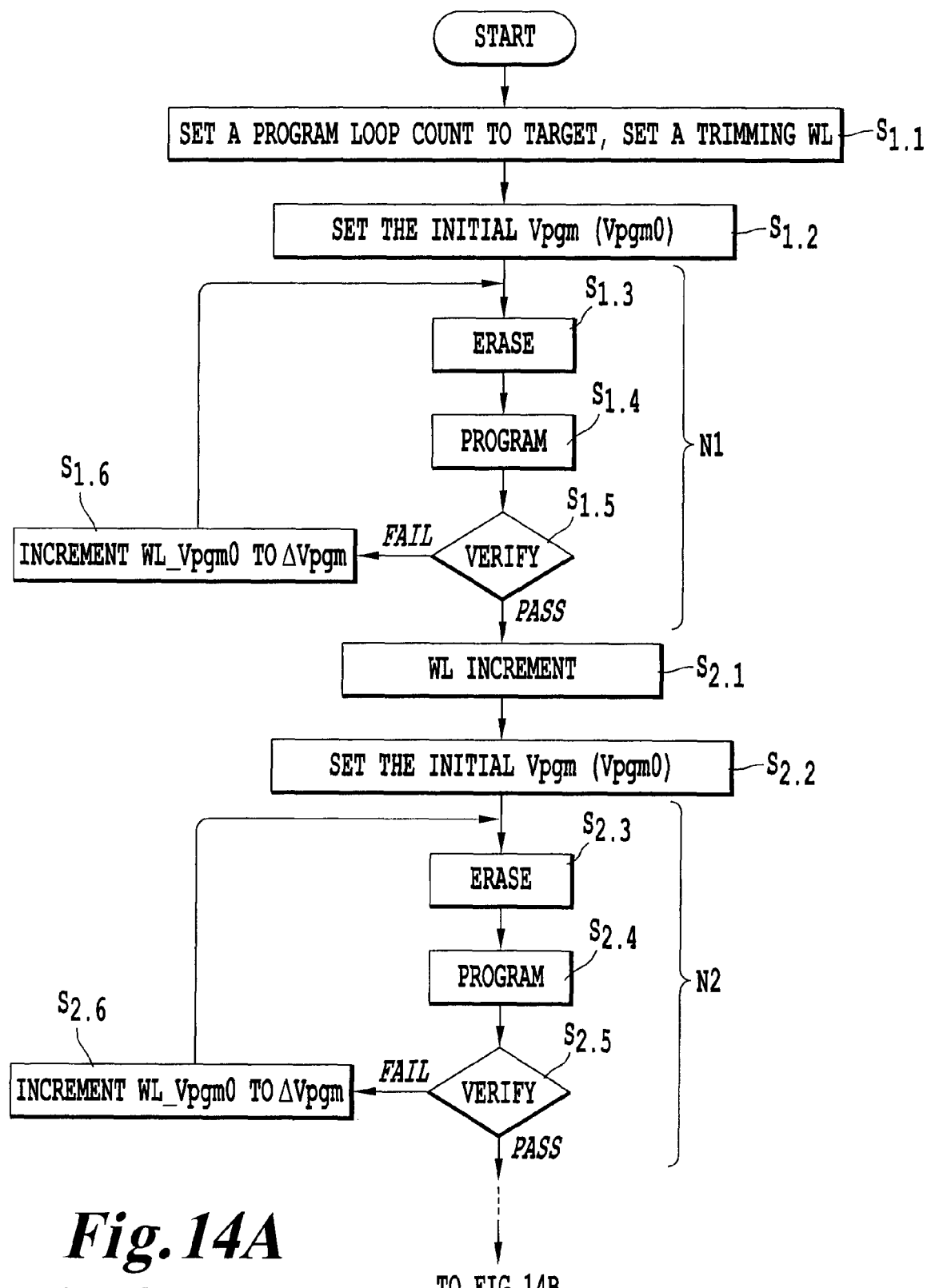
FIG. 14 is a flow chart of the adjustment (trimming) of the initial Vpgm in the NAND type flash memory.
Figure 14B:
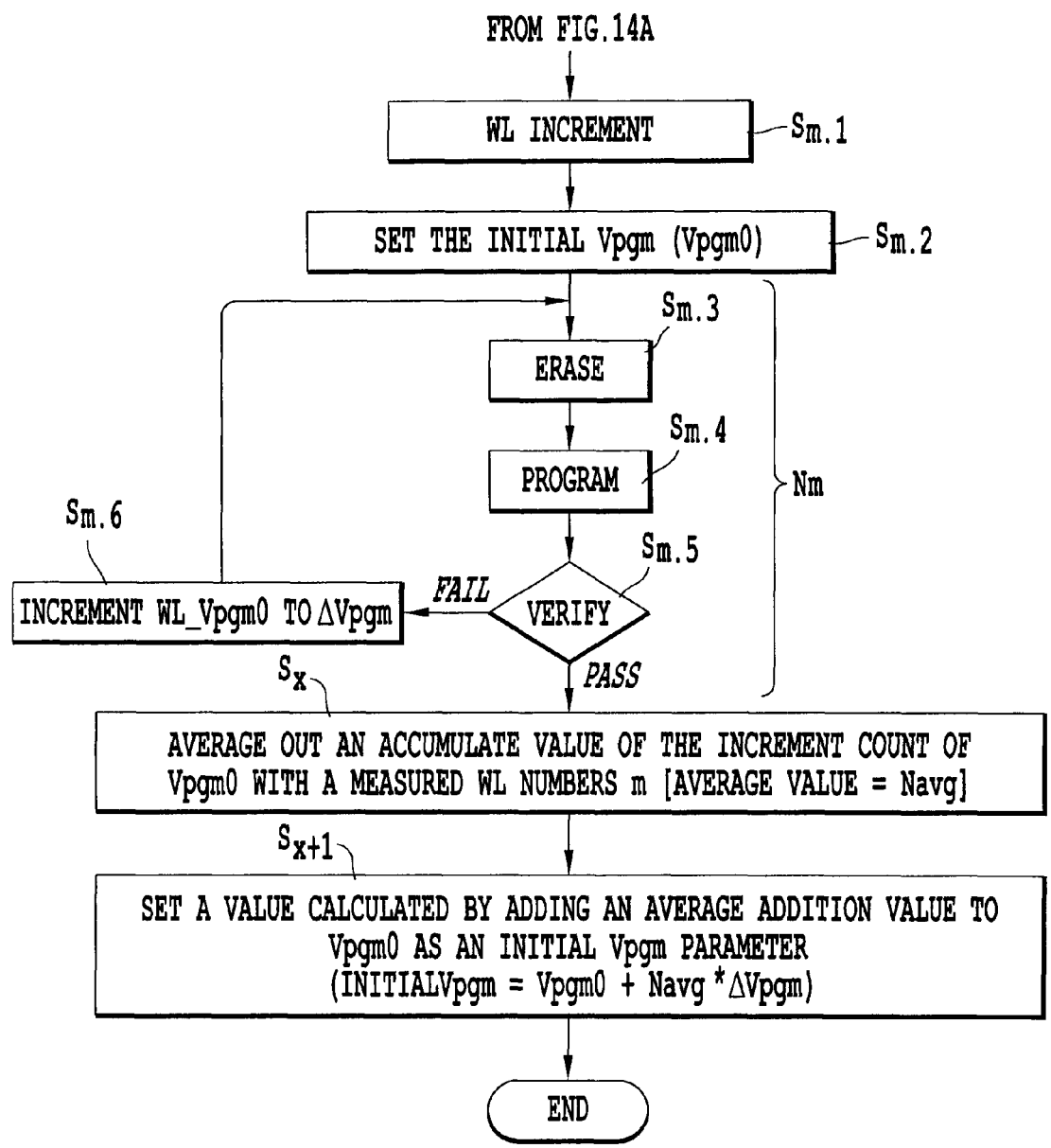

FIG. 14 shows a flow chart in the case where an adjustment (trimming) is made of an initial program voltage Vpgm which is applied to each word line (WL) in the NAND type flash memory. As shown in the figure, firstly in step 1.1 ($S_{1.1}$), the parameters of the number of programming loops to a memory cell (the target) and the address of a word line WL to be trimmed are set.

Next, in Step 1.2 ($S_{1.2}$), the parameters of an initial program voltage Vpgm (Vpgm) are set.

Next, in Step 1.3 ($S_{1.3}$), data of the target is erased.

Subsequently in Step 1.4 ($S_{1.4}$), data is programmed to the target.

Next in Step 1.5 ($S_{1.5}$), verification readout is performed. In the verification readout in Step 1.5 ($S_{1.5}$), data program is completed if all of the results are pass (Pass); on the other hand, if any result is fail, the process shifts to Step 1.6 ($S_{1.6}$).

In Step 1.6 ($S_{1.6}$), the initial program voltage Vpgm 0 is incremented by $\Delta$Vpgm. This operation is performed automatically by a command input. After this, the process returns to Step 1.3 ($S_{1.3}$) and the process between Step 1.3 ($S_{1.3}$) to Step 1.5 ($S_{1.5}$) is repeated until all the verification readouts in Step ($S_{1.5}$) are passed (Pass). At this time, the number of times (N2) which the initial program voltage Vpgm0 (N1) is incremented is stored in a cumulative register within the circuit.

Next, in Step 2.1 ($S_{2.1}$), a word line WL is incremented. Here, incrementing a word line WL means changing the word line WL which is to be trimmed to a word line WL adjacent to the bit line BL side. After this, the same processes as from Step 1.2 ($S_{1.2}$) to Step 1.6 ($S_{1.6}$) are performed from Step 2.2 ($S_{2.2}$) to Step 2.6 ($S_{2.6}$). At this time, the number of times (N2) which the initial program voltage Vpgm0 is incremented is stored in the cumulative register within the circuit.

Next the same operations as in Steps 2.1 ($S_{2.1}$) to Step 2.6 ($S_{2.6}$) are repeated until the number of times the initial program voltage Vpgm0 is incremented reaches the number of word lines WL which are to be measured (m in this example).

Next, in Step x ($S_x$), the number of times the initial program voltage Vpgm0 is incremented, which is stored in the cumulative register, is accumulated, and is averaged (average value=Navg) by the number of word lines WL in which a cumulative value is measured (m in this example).

Next, in Step x+1 ($S_{x+1}$), a voltage calculated by adding an average addition value (Navg*$\Delta$Vpgm) to Vpgm0 is set to the parameter as an initial Vpgm of a new chip (initial program voltage Vpgm=Vpgm0+Navg*$\Delta$Vpgm).

Here in the NAND type flash memory, in the case where an attempt is made to set the parameter of the initial program voltage Vpgm which is set to each word line WL, a calculation process must be performed using an external tester such as a CPU or a memory.

Next, embodiments of the nonvolatile semiconductor memory and the nonvolatile memory system will be explained. However, the present invention is not limited to these embodiments.

Embodiment One

FIG. 1 is a block diagram showing one example of the nonvolatile memory system according to Embodiment one of the present invention. As shown in the figure, the nonvolatile memory system has a NAND type flash memory 1 which is a nonvolatile semiconductor memory, and a flash controller 2 which is a memory controller.

The flash controller 2 controls the NAND type flash memory 1. For example, the flash controller 2 accesses the NAND type flash memory 1 according to a request from a system 3 (for instance, an external host), and controls data readout, data program and data erase.

The NAND type flash memory 1 has a control pin and an input/output pin. The control pin is basically a pin for receiving control signals from the flash controller 2. The input/output pin is basically a pin for performing transmission and reception of data to and from the flash controller 2, for reception of commands from the flash controller 2, and for transmitting a status to the flash controller 2. In this example, there are control pins /CE (Chip Enable), ALE (Address Latch Enable), CLE (Command Latch Enable), /WE (Write Enable), /RE (Read Enable), RY/BY (Ready/Busy), /WP (Write Protect), and input/output pins I/O 1 to I/O 8. These control pins and input/output pins are connected to the flash controller 2. In addition, the NAND type flash memory 1 has a ROM fuse 11. The ROM fuse 11 stores parameters on circuit operation of the NAND type flash memory 1 (reference voltage, readout/program/erase voltage initial value, bad block address data, bad column address data, etc.).

Figure 2:
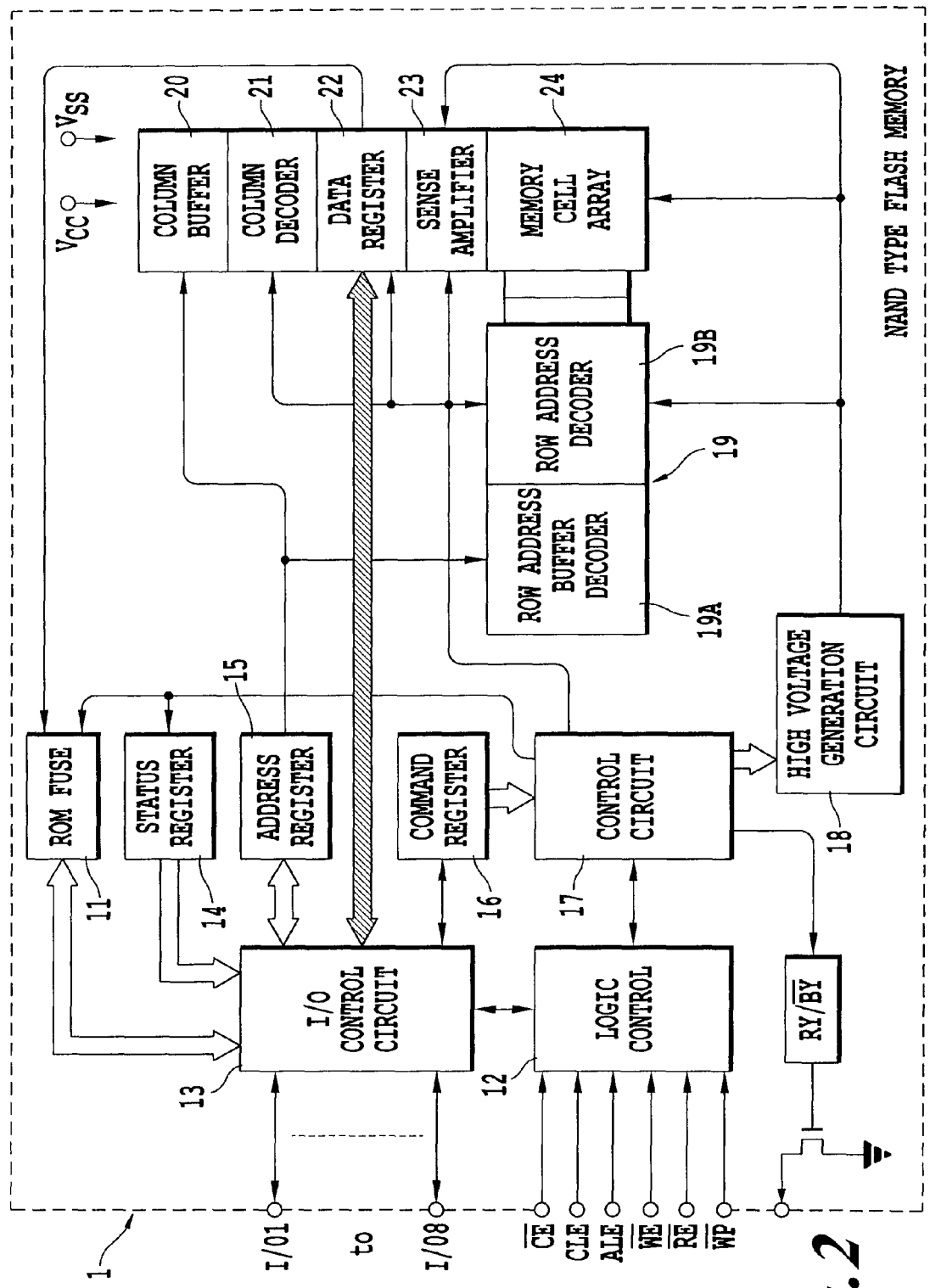
FIG. 2 is a block diagram showing one example configuration of the NAND type flash memory 1 according to Embodiment one of the nonvolatile semiconductor memory of the present invention.

In FIG. 2, one example of a configuration of the NAND type flash memory 1 is shown. As shown in the figure, the NAND type flash memory 1 has, in addition to the above described control pins, input/output pins and ROM fuse 11, a logic control 12, an I/O control circuit 13, a status register 14, an address register 15, a command register 16, a control circuit 17, a high voltage generation circuit 18, row decoders (a row address buffer decoder 19A and a row address decoder 19B) 19, a column buffer 20, a column decoder 21, a data register 22, a sense amplifier 23 and a memory cell array 24. The ROM fuse 11 may be formed using memory cells which have the same construction as the memory cells integrated in the memory cell arrays 24. The data stored in the ROM fuse 11 may be re-programmed in a similar way to the data stored in the normal memory cells.

Figure 3:
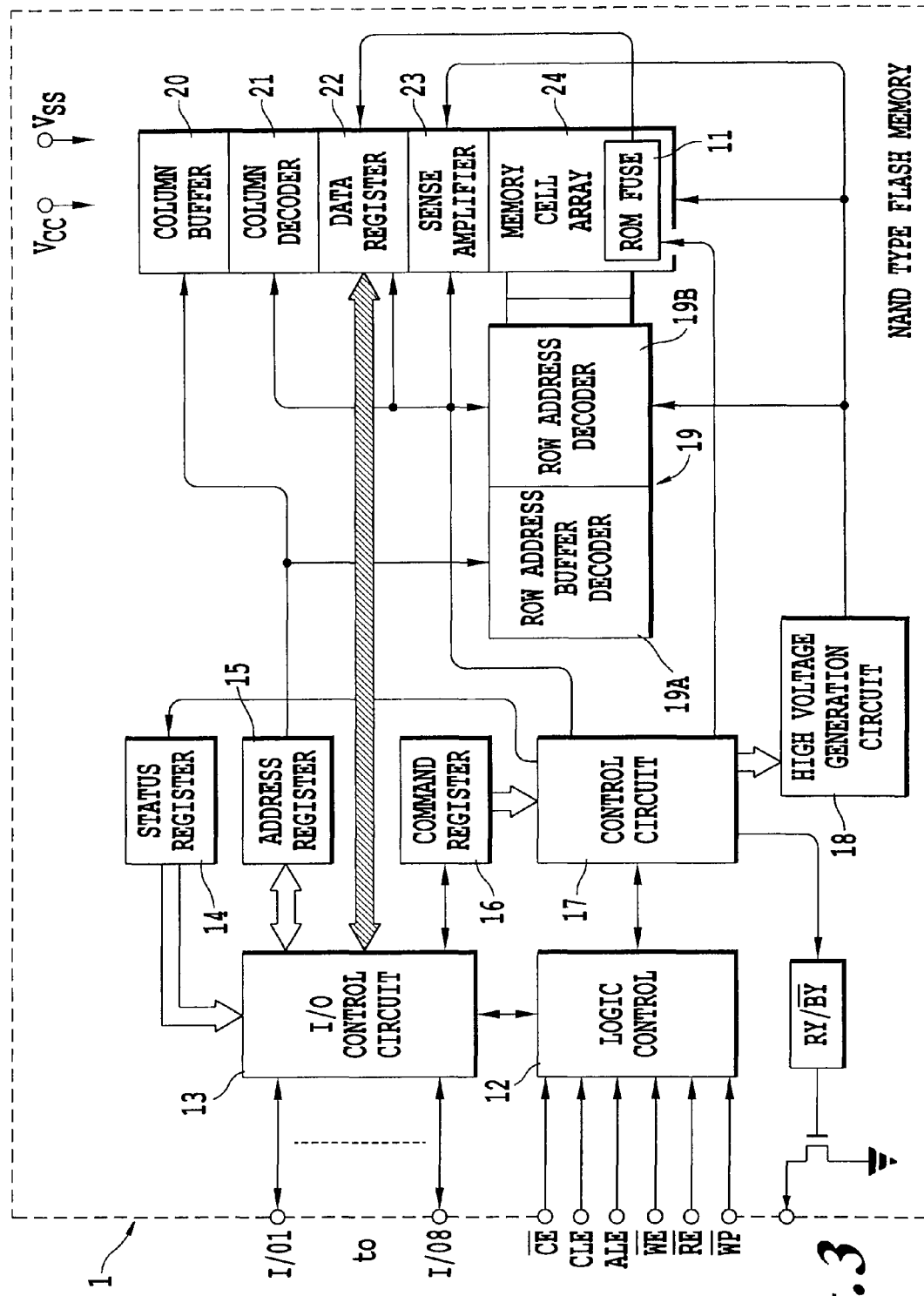
FIG. 3 is a block diagram showing other example configurations of the NAND type flash memory 1 according to Embodiment one of the nonvolatile semiconductor memory of the present invention.

In addition, as shown in FIG. 3, the ROM fuse 11 may be located within the region of the memory cell array 24. That is to say, memory cells of a part of the memory cell array 24 may be used as memory cells of the ROM fuse 11. Data stored in the ROM fuse 11 is read out to the data register 22 from the memory cells of the ROM fuse 11 when power is turned on and the operation of the NAND type flash memory 1 is optimized.

Figure 4:
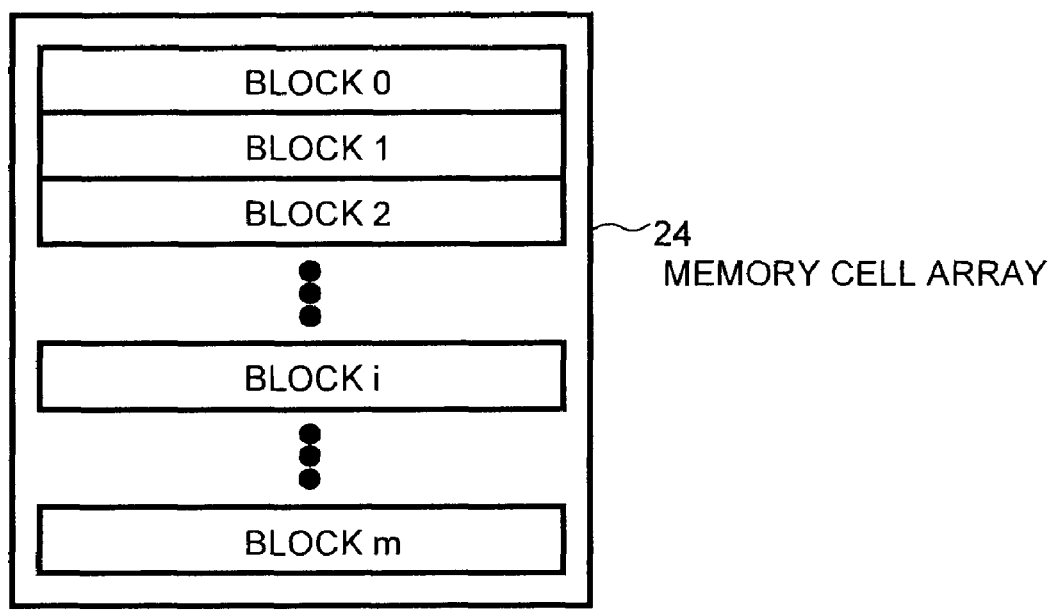
FIG. 4 is a circuit diagram showing one example configuration of the memory cell array 24 of the NAND type flash memory 1 according to Embodiment one of the nonvolatile semiconductor memory of the present invention.

In FIG. 4, a circuit diagram of one configuration example of the memory cell array 24 shown in FIG. 2 and FIG. 3 is shown. As shown in the figure, the memory cell array 24 is divided into a total of m blocks (BLOCK 0, BLOCK 1, BLOCK 2, . . . , BLOCK i, . . . , BLOCK m). Here, "a block" is a minimum unit of data erasure.

Figure 5:
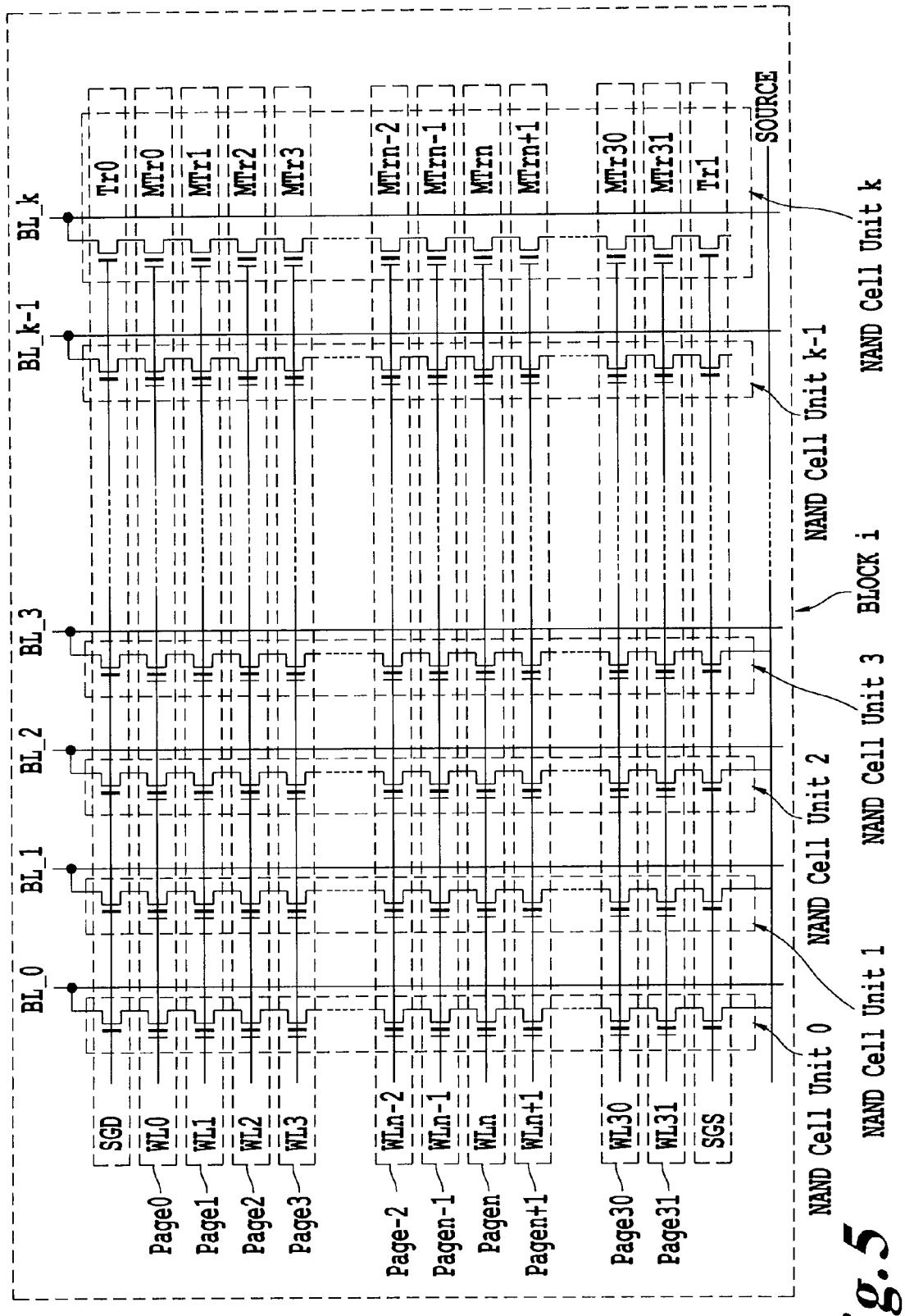
FIG. 5 is a diagram showing a configuration of the block BLOCKi of the NAND type flash memory 1 according to Embodiment one of the nonvolatile semiconductor memory of the present invention.

Also, each of the blocks BLOCK 0 to BLOCK m is respectively comprised of k NAND cell units 0 to k, similar to the block BLOCK i shown typically in FIG. 5. In Embodiment one, each of the NAND cell units is comprised of 32 memory cells MTr0 to MTr31 connected in series. One end of each of the memory cells MTr0 to MTr31 is connected to the bit lines BL (BL_0, BL_1, BL_2, BL_3, . . . , BL_k−1, BL_k) via a selection gate transistor Tr0 which is connected to a selection gate line SGD. The other end of each of the memory cells MTr0 to MTr31 is connected to the common source line SOURCE via the selection gate transistor Tr1 which is connected to the selection gate line SGS. The control gates of each memory cell MTr are connected to the word lines (WL0 to WL31). The present invention is used especially preferably in the NAND type flash memory with multi bit memory in which each of k memory cells MTr connected to one word line WL stores a plurality of data bits (multi bit data) corresponding to the amount of electron injection. Usage is not limited to this but it is also possible to use the NAND type flash memory in which each memory cell stores one bit of data. Also, k memory cells Mtr comprise a unit called "a page."

Figure 6:
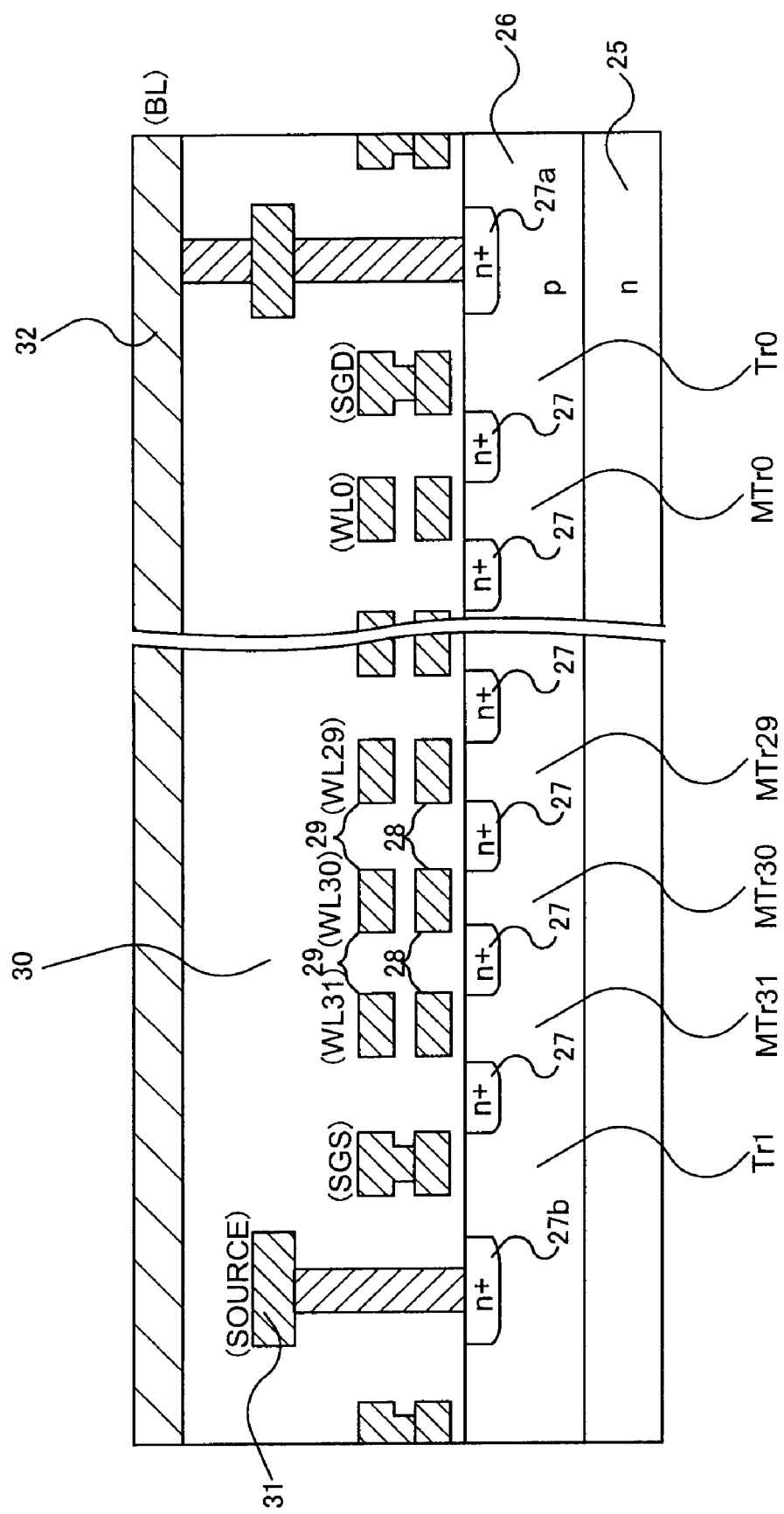
FIG. 6 is a cross sectional view along the bit line BL of one NAND cell unit of the NAND type flash memory 1 according to Embodiment one of the nonvolatile semiconductor memory of the present invention.

In FIG. 6, a cross section along bit line BL of one NAND cell unit is shown. Memory cells MTr are formed in a p type well 26 formed on an n type silicon substrate or an n type well 25. The memory cells Mtr are comprised of a stacked structure of floating gates 28 and control gates 29, and adjacent memory cells share a source and drain diffusion layer 27. The control gates 29 are patterned to a word line WL which is common to the plurality of memory cells MTr in a direction which is perpendicular to the surface of the figure. The memory cell array 24 is covered with an interlayer insulation film 30. A common source line (SOURCE) 31 within the blocks embedded within the interlayer insulation film 30 contacts with a source diffusion layer 27b of the selection gate transistor Tr1 at the common source line (SOURCE) side. The bit line (BL) 32 which is formed on the interlayer insulation film 30 contacts with a drain diffusion layer 27a of the selection gate transistor Tr2 at the bit line BL side. The contact of this common source line (SOURCE) 31 and bit line (BL) 32 is shared by adjacent memory cells MTr.

Thus, in the NAND type flash memory 1, adjacent memory cells MTr within the NAND cell unit share a diffusion layer, and adjacent NAND cell units share a wire contact. A detailed description is omitted, however, an element region and an element separation region having a stripe pattern are alternately arranged in a direction which is perpendicular to the surface of FIG. 6 and memory cells MTr are formed at each point of intersection between each of the element regions and the word lines WL of the stripe pattern which is perpendicular to each of the element regions. From these structural characteristics, high integration and large capacity can be obtained in the NAND type flash memory 1.

Also in Embodiment one, the number of blocks which comprise the memory cell array 24 is set at m, with one block including k NAND cell units composed of 32 memory cells MTr. The present invention is not limited to this, but the number of blocks, the number of memory cells MTr and the number of NAND cell units may be changed according to desired capacity. Also in Embodiment one, an example is explained in the context of a NAND type flash memory in which one NAND cell unit is connected to one bit line BL. In addition, the present invention may be applied to a so-called shared bit line (Shared Bit Line) type NAND type flash memory in which a plurality of NAND cell units share one bit line BL.

Figure 7:
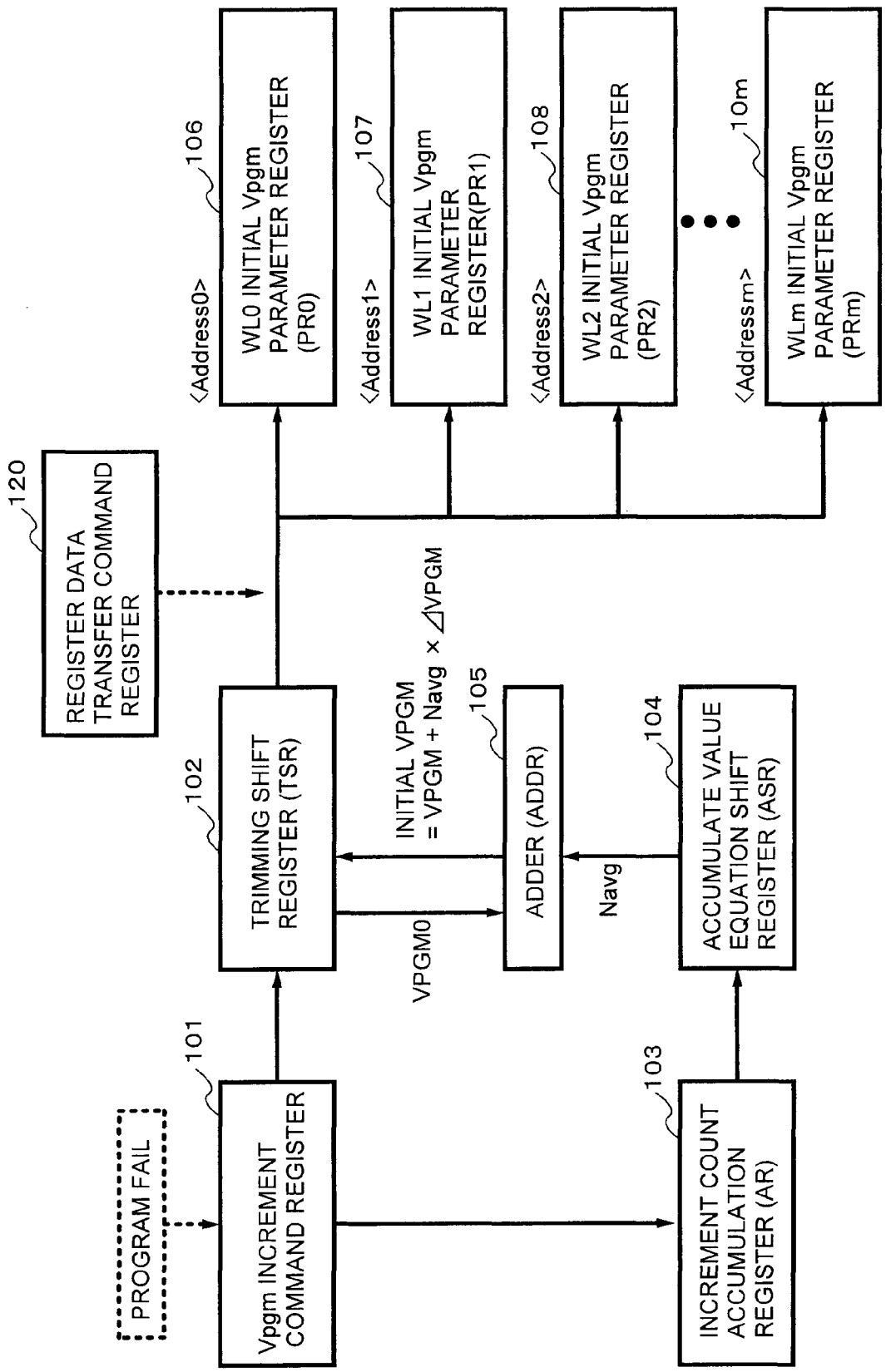
FIG. 7 is a diagram showing a trimming circuit which provides an adjusted (trimmed) initial parameter Vpgm to each word line WL of the NAND type flash memory 1 according to Embodiment one of the nonvolatile semiconductor memory of the present invention.

Next, adjustment (trimming) of the initial Vpgm in the NAND type flash memory 1 of Embodiment one will be explained. Firstly FIG. 7 shows an adjustment circuit (hereafter called a trimming circuit) which provides a parameter of the initial Vpgm which is adjusted (trimmed) for each word line WL in the NAND type flash memory 1. This trimming circuit is comprised by a part of the control circuit 17 and also controlled by the control circuit 17. In addition, the trimming circuit may be comprised separately from the control circuit 17. As shown in FIG. 7, the trimming circuit includes a Vpgm increment command register 101, a trimming shift register (TSR) 102, an increment count accumulation register (AR) 103, an accumulated value equation shift register (ASR) 104, an adder (ADDR) 105, WL0 to WLm initial Vpgm parameter registers (PR0 to PRm) 106, 107, 108, . . . , 10m and a register data transfer command register 120. The Vpgm increment command register 101 outputs a command which increments the program voltage Vpgm. The trimming shift register (TSR) 102 increases (increments) the program voltage Vpgm. The increment count accumulation register (AR) 103 accumulates the number of times the program voltage Vpgm is incremented. The accumulated value equation shift register (ASR) 104 averages a value which is accumulated. The adder (ADDR) 105 adds the averaged value to the initial program voltage Vpgm0. In the present Embodiment one, only one trimming circuit is prepared because providing a trimming circuit for each word line WL leads to an increase in the number of circuits. In the trimming circuit, a command to transfer data to every word line WL of each initial Vpgm parameter register (PR0 to PRm) 106, 107, 108, . . . , 10m from trimming shift register (TSR) 102 is prepared. After adjusting (trimming) the initial Vpgm, it is set so that a value to be adjusted (trimmed) is transferred to each of the parameter registers (PP0 to PRm) 106, 107, 108, . . . , 10m. In each of the initial Vpgm parameter registers (PR0 to PRm) 106, 107, 108, . . . , 10m, addresses (Address 0 to Address m) are assigned. In the register transfer command register 120, transfer of data to each of the initial Vpgm parameter registers (PR0 to PRm) 106, 107, 108, . . . , 10m becomes possible by issuing the data transfer command in which each of the addresses is set. Because there is a parameter of the initial Vpgm for each word line WL, the parameters increase (increase in the number of circuits). However, there is no increase or decrease in parameters (circuits) because the voltage shift value (offset value) from the initial Vpgm of each word line WL is not required. In addition, the parameter of the initial Vpgm which is adjusted (trimmed) for each word line is not always required to be set for all the word lines. For instance, it is possible to minimize an increase in the number of circuits by setting only the most appropriate number of parameters, such as 3 parameters, i.e., a parameter for a word line WL adjacent to the selection gate Tr1 at the common source (SOURCE) side; a parameter for a word line WL adjacent to the selection gate Tr0 at the bit line (BL) side and a parameter for a different word line WL etc.

Figure 8:
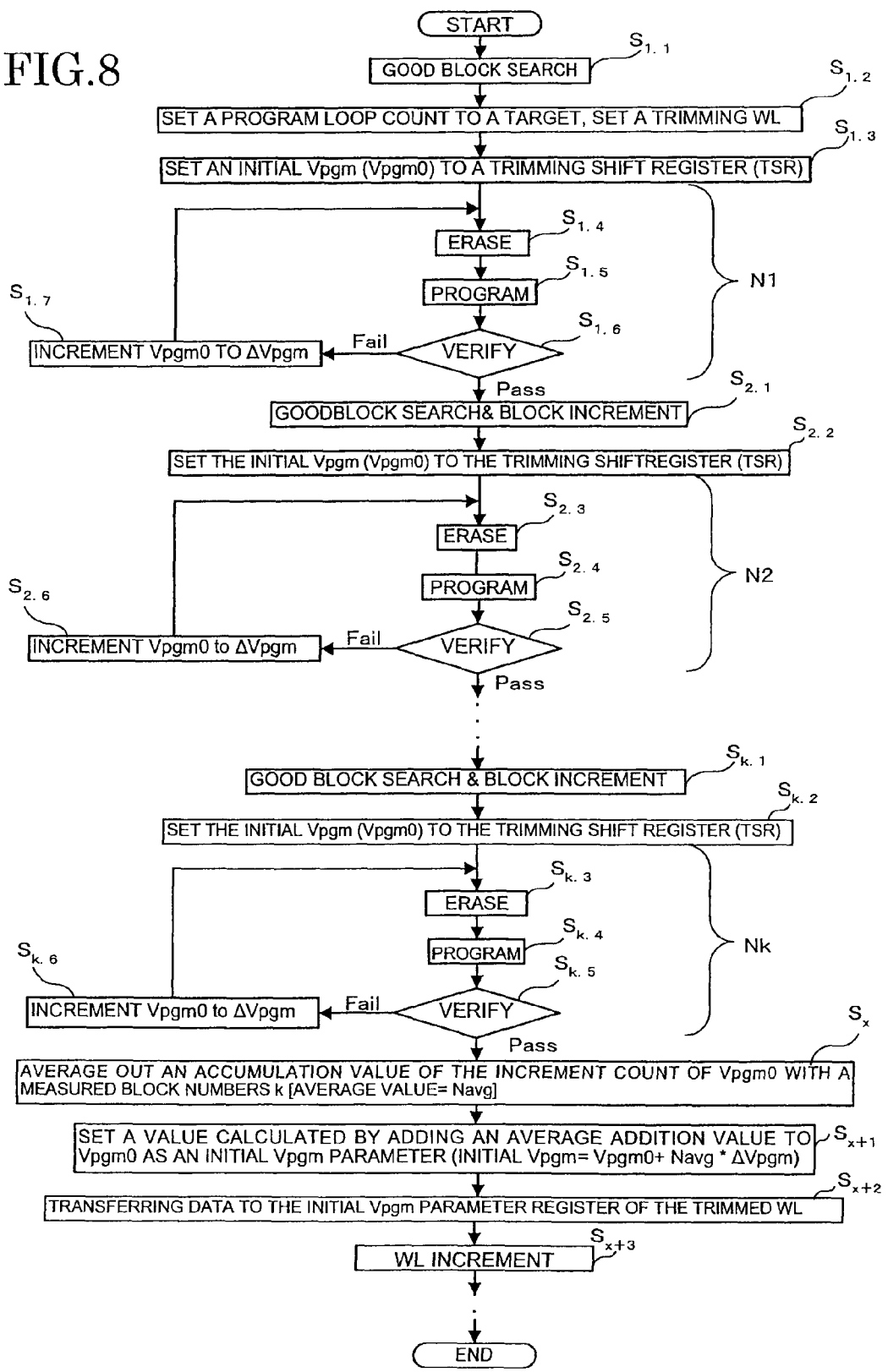
FIG. 8 is a flow chart of the adjustment (trimming) of the initial Vpgm in the NAND type flash memory according to Embodiment one of the nonvolatile semiconductor memory of the present invention.

Next, in FIG. 8, a flow chart relating to the adjustment (trimming) of the initial program voltage Vpgm performed in the NAND type flash memory 1 relating to Embodiment one is shown. As shown in FIG. 8, at first in Step 1.1 ($S_{1.1}$), the trimming circuit performs a search of normal blocks (Good Block Search). In this Good Block Search, specifically, after erasing the block, program is performed to all the word lines WL in the block. Additionally, a verify operation is performed and a block which passes (Pass) is searched. In addition, for reference a detailed description of this Good Block Search is disclosed in a patent application by the present applicant (JP2002-117.699A). In addition, because the trimming circuit is arranged with a function which excludes a block which does not pass a verify operation, a Good Block Search does not have to be performed. If doing so, it is not necessary to perform a Good Block Search every time the block is incremented and therefore it becomes possible to shorten the testing time.

Next in Step 1.2 ($S_{1.2}$), setting of the parameter of the number of program loops to a memory cell (target) of the initial normal block and setting of an address of the trimming word line WL which is trimmed are performed using an external input device. In addition, the number of program loops may be arbitrarily set. The setting value of the parameter of the number of program loops and the setting value of the address of the word line WL which is trimmed are stored in the ROM fuse 11 (FIG. 2 and FIG. 3) by an external input device via the above-described control pin, the above-described input-output pin and the I/O control circuit 13.

Next, in Step 1.3 ($S_{1.3}$), the parameter of the initial program voltage (Vpgm 0) is set in the trimming shift register (TSR) 102 using an external input device. Vpgm0 may be arbitrarily set, for instance, it may be set to 14 V. The parameter of the initial program voltage (Vpgm 0) is stored in the ROM fuse 11 (FIG. 2 and FIG. 3) by the external input device via the above-described control pin, the above-described output pin and the I/O control circuit 13.

Next in Step 1.4 ($S_{1.4}$), the trimming circuit performs data erase of the target based on the data stored in the ROM fuse 11 and the data register 22.

Next in Step 1.5 ($S_{1.5}$), the trimming circuit performs data program to the target based on the data stored in the ROM fuse 11 and the data register 22.

Next in Step 1.6 ($S_{1.6}$), the trimming circuit performs verification readout based on the data stored in the ROM fuse 11 and the data register 22. In the verification readout of Step 1.6 ($S_{1.6}$), if the all the results are pass (Pass), data program is complete, however, if the results are fail (Fail), the process shifts to Step 1.7 ($S_{1.7}$).

In Step 1.7 ($S_{1.7}$), the trimming shift register (TSR) 102 increases (increments) Vpgm 0 by ΔVpgm based on the data stored in the ROM fuse 11 and the data register 22. This operation can be performed automatically by a command input from the Vpgm increment command register 101. After this, in the trimming circuit, the process returns to Step 1.4 ($S_{1.4}$), and the process from Step 1.4 ($S_{1.4}$) to Step 1.7 ($S_{1.7}$) is performed repeatedly until all verification readouts in Step 1.6 ($S_{1.6}$) are passed (Pass). At this time, the number of times (N1) Vpgm 0 is incremented is stored in the increment count accumulation register (AR) 103 in the trimming circuit. In addition, ΔVpgm may be arbitrarily set, for instance, it may be set between 0.2 V and 1.0 V. ΔVpgm is then supplied to and stored in the ROM fuse 11 (FIG. 2 and FIG. 3) by an external input device via the above-described control pin, the above-described input-output pin and the I/O control circuit 13.

Next in Step 2.1 ($S_{2.1}$), the trimming circuit again performs the Good Block Search and increments the blocks to detect a normal block. After this, in the trimming circuit, the process from Step 2.2 ($S_{2.2}$) to Step 2.6 ($S_{2.6}$) is performed in the same way as in the process from Step 1.3 ($S_{1.3}$) to Step 1.7 ($S_{1.7}$). At this time, the number of times (N2) Vpgm 0 is incremented is stored in the increment count accumulation register (AR) 103 in the trimming circuit.

Next, the trimming circuit repeats the same process as in Step 2.1 ($S_{2.1}$) to Step 2.6 ($S_{2.6}$) until the number of times Vpgm 0 is incremented reaches the same number of blocks to be measured (k blocks in this example).

Next in Step x ($S_x$), the trimming circuit accumulates the number of times Vpgm is incremented which is stored in the increment count accumulation register (AR). The accumulate value equation shift register (ASR) 104 averages this accumulated value (average value=Navg) by the number of blocks measured (k blocks in the example).

Next in Step x+1 ($S_{x+1}$), the adder (ADDR) 105 adds an average addition value (Navg*ΔVpgm) to the initial program voltage Vpgm 0, and the added result is set to the trimming shift register (TSR) 102 as an initial Vpgm parameter of a new chip (initial Vpgm=Vpgm0+Navg*ΔVpgm).

Next in Step x+2 ($S_{x.2}$), the register data transfer command register 120 transfers data of the initial Vpgm parameter of the new chip which is set in the trimming shift register (TSR) 102 to the initial Vpgm parameter register corresponding to the word line WL which has been trimmed. It is possible for this operation to be performed by inputting the address corresponding to the initial Vpgm parameter register and the transfer command into the trimming shift register (TSR) 102.

Next in Step x+3 ($S_{x+3}$), the trimming circuit increments the word line WL. Here, incrementing the word line WL means changing the word line WL which is to be changed to the word line WL adjacent to the bit line BL side. After this, the trimming circuit repeats the same process from Step 1.1 ($S_{1.1}$) to Step x+3 ($S_{x+3}$) until the number of increment times is the same as the number (for instance, m) of word lines WL to be measured.

The WL0 to WLm initial Vpgm parameters which are set in the WL0 to WLm initial Vpgm parameter registers (PR0 to PRm) 106, 107, 108, . . . , 10m are stored in the ROM fuse (FIG. 2 and FIG. 3) by the control circuit 17 (FIG. 2 and FIG. 3). Here, the Rom fuse 11 has a predetermined region in which WL0 to WLm initial program voltage Vpgm parameters are stored. Then, the control circuit 17 (FIG. 2 and FIG. 3) controls the operations of each part of the NAND type flash memory device 1 and performs data program and data readout to and from the memory cell array 24 based on the initial Vpgm parameter stored in the ROM fuse 11 and the data stored in the data register 22.

In addition, the word lines WL0 to WLm initial Vpgm parameters which are set in the WL0 to WLm initial Vpgm parameter register (PR0 to PRm) 106, 107, 108, . . . , 10m, may be configured to be stored in a parameter storage section other than the ROM fuse 11 by the control circuit (FIG. 2 and FIG. 3). In this case, the control circuit (FIG. 2 and FIG. 3) controls operations of each part of the NAND type flash memory device 1 and performs data program and data readout to and from the memory cell array 24 based on data of the initial Vpgm parameter and the data register 22 stored in the parameter storage section.

By doing so, in the NAND type flash memory of the Embodiment one, it is possible to prepare an initial Vpgm parameter for each word line WL. As a result, it is not necessary to perform a calculation process using a CPU or a memory of an external tester and the test time can be reduced.

Embodiment Two

Next, Embodiment two of the present invention will be described in detail referring to the accompanying figures.

Embodiment two is different from Embodiment one in that a plurality of trimming circuits which provided for each word line WL, and a part of the sequence of adjusting (trimming) the initial program voltage Vpgm is different. Other than this, because the configuration of the nonvolatile semiconductor memory device in Embodiment two is the same as the nonvolatile semiconductor memory device in Embodiment one, an explanation of its structure will not be explained again here.

In the above-described Embodiment one, a method has been applied where only one trimming circuit is prepared for providing a parameter of the initial program voltage Vpgm which is adjusted (trimmed) for each word line WL in order to prevent an increase in the number of trimming circuits, and the adjustment result is transferred to the initial Vpgm parameter register (PR0 to PRm) corresponding to each of the word lines WL. In Embodiment two, the above-described trimming circuit is set to each word line WL. In this way, a plurality of voltages can be adjusted (trimmed) in one test flow and thus the test time can be further shortened.

Figure 9:
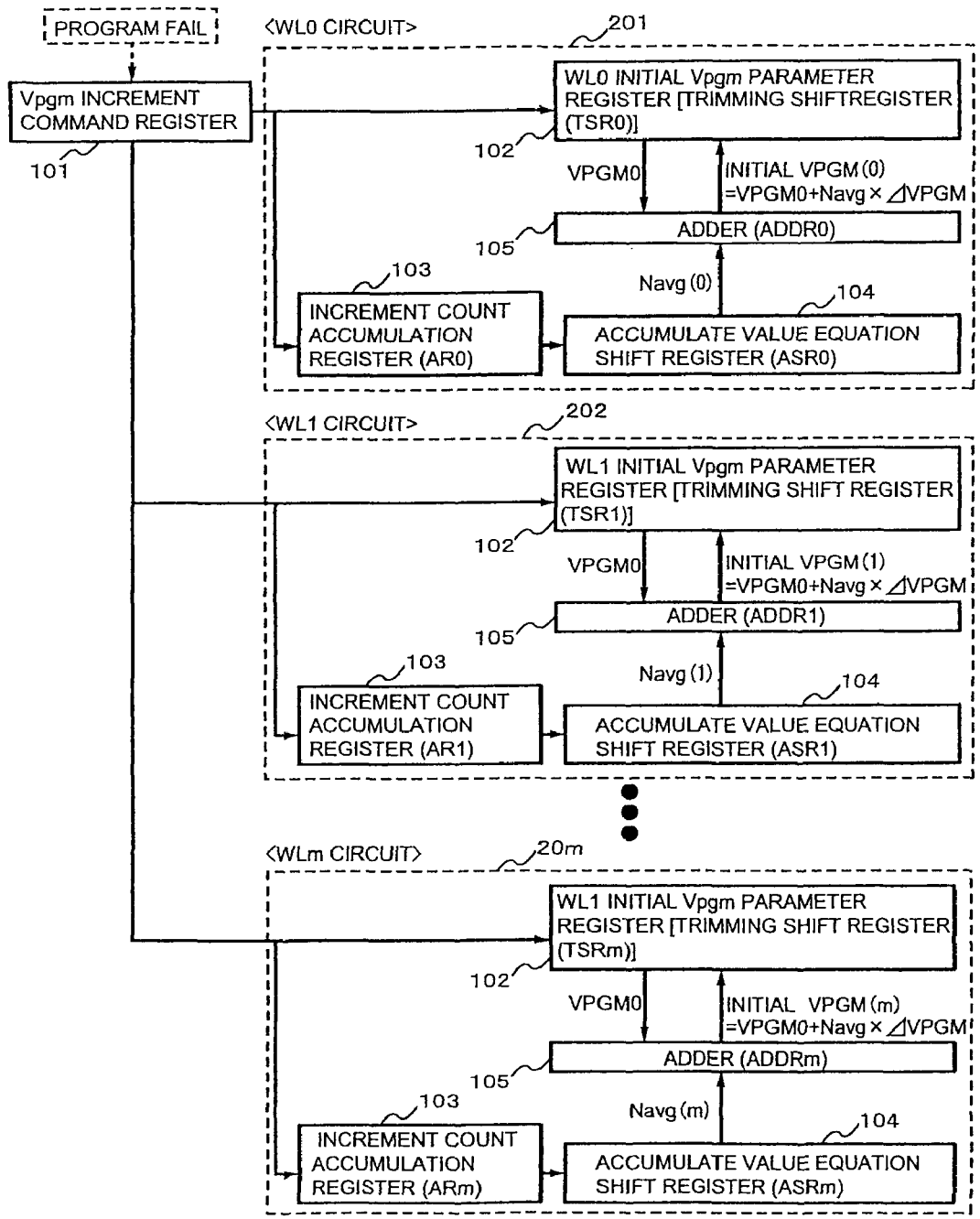
FIG. 9 is a diagram showing a trimming circuit which provides an adjusted (trimmed) initial parameter Vpgm to each word line WL of the NAND type flash memory 1 according to Embodiment two of the nonvolatile semiconductor memory of the present invention.

FIG. 9 is a block diagram showing a trimming circuit which provides parameters of an adjusted (trimmed) initial program voltage Vpgm for each word line WL of the NAND type flash memory 1 according to. This trimming circuit may be comprised by a part of the control circuit 17. In addition, this trimming circuit may be composed separately from the control circuit 17. As shown in the figure, the trimming circuit includes the Vpgm increment command register 101 and trimming circuits (WL0 to WLm circuit) 201, 202, . . . , 20m of each of the word lines WL. Each of the word lines trimming circuit (WL0 to WLm circuit) 201, 202, . . . , 20m includes the trimming shift register (TSR0 to TSRm) 102, the increment count accumulation register (AR0 to ARm) 103, the accumulate value equation shift register (ASR0 to ASRm) 104 and the adder (ADDR0 to ADDRm) 105, respectively. In addition, in Embodiment two, the trimming shift register (TSR0 to TSRm) 102 also functions as a parameter register of the initial program voltage Vpgm. In addition, the WL0 to WLm trimming shift register (TSR0 to TSRm) 102 may be separated from the W00 to WLm initial program voltage Vpgm parameter registers (PR0 to PRm). The functions of the trimming shift registers (TSR0 to TSRm) 102, the increment count accumulation registers (AR0 to ARm) 103, the accumulate value equation shift registers ASR0 to ASRm) 104, the adder (ADDR0 to ADDRm) 105 and parameter register 102 of initial program voltage Vpgm according to Embodiment 2 Embodiment two, are the same as those in the above-described Embodiment one.

Figure 10:
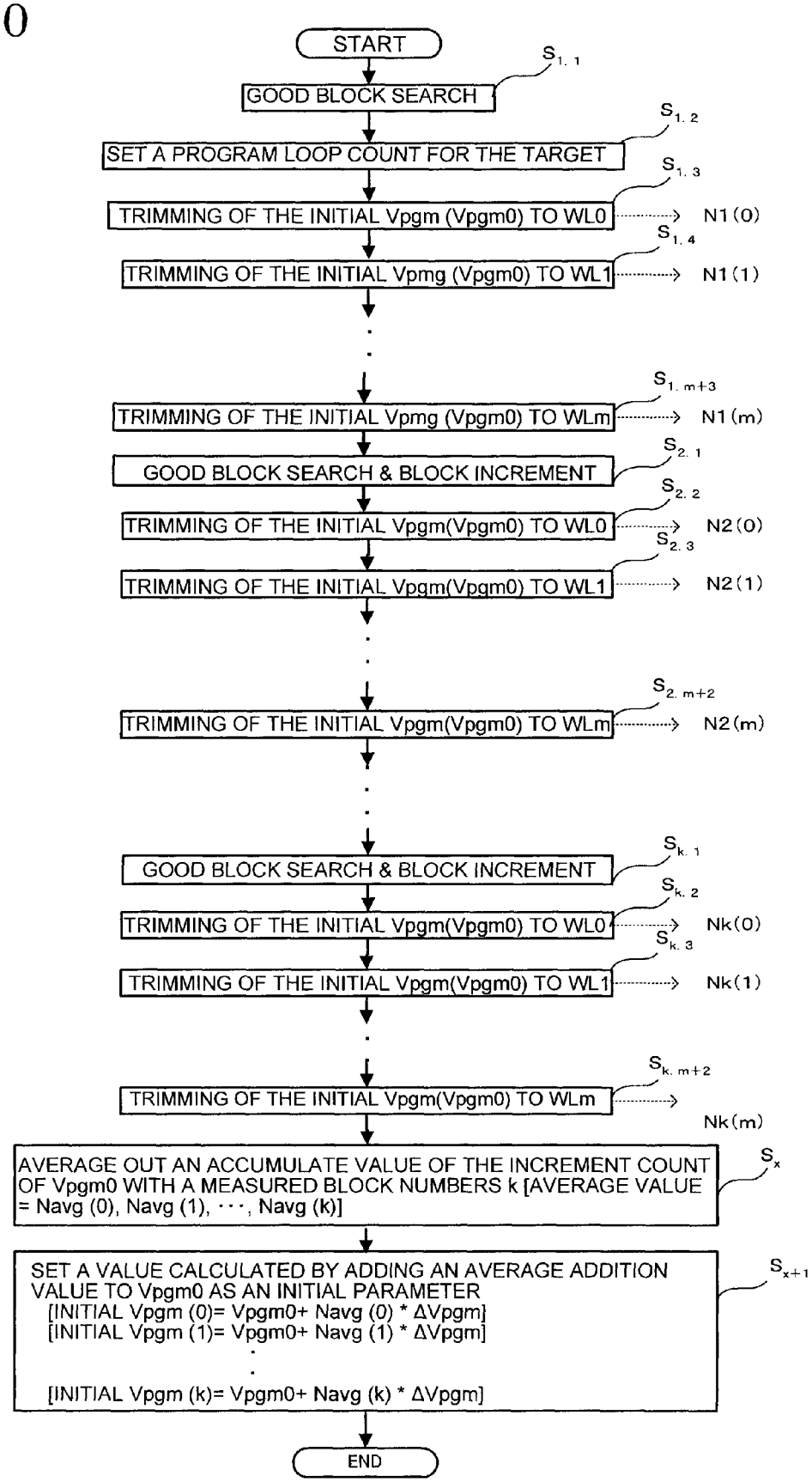
FIG. 10 is a flow chart of the adjustment (trimming) of the initial Vpgm in the NAND type flash memory according to Embodiment two of the nonvolatile semiconductor memory of the present invention.

FIG. 10 is a flow chart for describing the adjustment (trimming) operation of the initial program voltage Vpgm in the NAND type flash memory 1 according to Embodiment two.

Step 1.1 ($S_{1.1}$) is the same as that of the above-described Embodiment one (the flow chart of FIG. 8), so a description will be omitted.

Next in Step 1.2 ($S_{1.2}$), a parameter of the number of program loops to a memory cell (target) of the first normal block using an external input device is set. In addition, the number of program loops may be arbitrarily set. The set value (set value) of the parameter of the number of program loops is stored in the ROM fuse 11 (FIG. 2 and FIG. 3) by an external input device via the above-described control pin, the above-described input-output pin and the I/O control circuit 13.

Next in Step 1.3 ($S_{1.3}$), the trimming circuit performs the adjustment (trimming) of the initial program voltage Vpgm (Vpgm 0) to the word line WL0 based on the data stored in the ROM fuse 11 and the data register 22. The adjustment (trimming) of the initial program voltage Vpgm0 to the word line WL0 may be performed by the same process as that from the above-described Step 1.3 ($S_{1.3}$) to Step 1.7 ($S_{1.7}$) of Embodiment one. In this case, the number of times N1 (0) which the initial program voltage Vpgm0 is incremented to the word line WL0, is stored in the increment count accumulation register (AR) 103 in the trimming circuit.

Next in Step 1.4 ($S_{1.4}$), the trimming circuit performs the processes the same as in Step 1.3 ($S_{1.3}$) the adjustment (trimming) of the initial program voltage Vpgm to the word line WL1, based on data stored in the ROM fuse 11 and the data register 22. Then, the trimming circuit repeats the same process until the same number of increment times as the number of word lines to be measured (m in the example) is reached. At this time, the number of times (N1(1) to N1($m$)) in which the initial program voltage Vpgm0 is incremented for each of the word lines, is stored in the increment count accumulation register (AR) 103 in the trimming circuit.

Next, in Step 2.1 ($S_{2.1}$), the trimming circuit again performs the Good Block Search and increments the blocks until a normal block is detected. After this, the trimming circuit performs a process from Step 2.2 ($S_{2.2}$) to Step 2.$m$+2 ($S_{2.m+2}$), the same as the process from Step 1.3 ($S_{1.3}$) to Step 1.$m$+3 ($S_{1.m+3}$). At this time, the number of times (N2(0) to N2($m$)) which the initial program voltage Vpgm0 is incremented for each of the word lines is stored in the increment count accumulation register (AR) 103 in the trimming circuit.

Next, the trimming circuit repeats the same process as in Step 2.1 ($S_{2.1}$) to Step 2.6 ($S_{2.6}$) until the same number of increment times as the number of blocks to be measured (k in the example) is reached.

Next in Step x ($S_x$), the accumulate value equation shift register (ASR) 104 accumulates the number of increment times of the initial program voltage Vpgm0 stored in the increment count accumulation register (AR) 103. The accumulate value equation shift register (ASR) 104 averages this accumulation value (average value=Navg(0), Navg(1), . . . , Navg(k)) with the number of blocks to be measured (k in the example).

In Step x+1 ($S_{x+1}$), the adder (ADDR0 to ADDRm) 105 generates a result which is calculated by adding an average addition value (Navg×ΔVpgm) to the initial program voltage Vpgm0 and the result is set to the trimming shift register (TSR) 102 as an initial Vpgm parameter of a new chip (initial Vpgm(0)=Vpgm0+Navg(0)*ΔVpgm, initial Vpgm(1)= Vpgm0+Navg(1)*ΔVpgm, . . . , initial Vpgm(k)=Vpgm0+ Navg(k)*ΔVpgm).

The WL0 to WLm initial Vpgm parameters set in the WL0 to WLm initial Vpgm parameter registers (PR0 to PRm) 102 relating to Embodiment two are stored in the ROM fuse 11 (FIG. 2 and FIG. 3) by the control circuit 17 (FIG. 2 and FIG. 3). Here, the ROM fuse 11 has a predetermined region in which the WL0 to WLm initial Vpgm parameters are stored. In addition, the control circuit 17 (FIG. 2 and FIG. 3) controls operations of each section of the NAND type flash memory device 1 and performs data program and data readout to and from the memory cell array 24 based on the initial Vpgm parameters stored in the ROM fuse 11 and the data stored in the data register 22.

In addition, The WL0 to WLm initial Vpgm parameters set in the WL0 to WLm initial Vpgm parameter registers (PR0 to PRm) 102 relating to Embodiment two may be configured to store parameters in a parameter storage section other than the ROM fuse 11 by the control circuit 17 (FIG. 2 and FIG. 3). In this case, the control circuit 17 (FIG. 2 and FIG. 3) controls the operations of each section of the NAND type flash memory device 1 and performs data program and data readout to and from the memory cell array 24 based on the initial Vpgm parameter stored in the parameter storage section and the data stored in the data register 22.

In addition in Embodiment two, the transfer operation to the parameter register as in the above-described Embodiment one is not necessary because the transfer operation has the same effect as the above-described Embodiment one and the trimming shift register (TSR) 102 is also used as a parameter register of the initial program voltage Vpgm.

Embodiment Three

Next, Embodiment three will be described in detail while referring to the accompanying figures.

In Embodiment three, parameters which set a voltage shift value (offset value) from the initial program voltage Vpgm are prepared for each word line WL. The configuration of Embodiment three other than this will not be described again, since other configurations are the same as the nonvolatile semiconductor memory and the nonvolatile memory system of the above-described Embodiment one.

Figure 11:
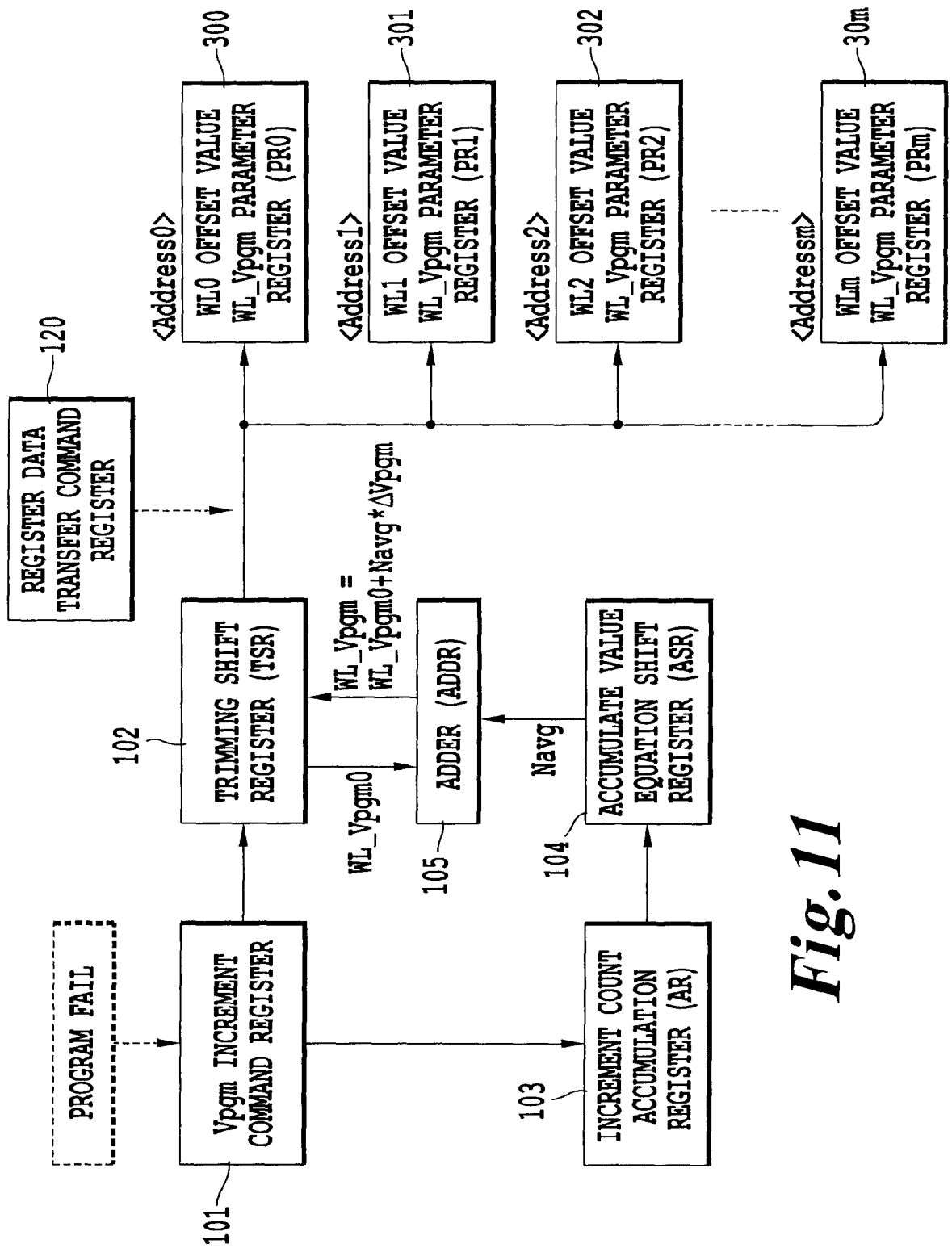
FIG. 11 is a diagram showing a trimming circuit which provides a parameter of a voltage shift value (offset value) from an adjusted (trimmed) initial Vpgm to each word line WL of the NAND type flash memory 1 according to Embodiment three of the nonvolatile semiconductor memory of the present invention.

FIG. 11 is a block diagram showing the trimming circuit which provides the parameter of the voltage shift value (offset value) which is adjusted (trimmed) to the initial program voltage Vpgm for each word line WL of the NAND type flash memory 1 of Embodiment three. The trimming circuit is comprised by a part of the control circuit 17. The trimming circuit is controlled by the control circuit 17. In addition, the trimming circuit may be comprised separately from the control circuit 17. As shown in the figure, this trimming circuit is different only in that the subject parameter is changed to the voltage shift value (offset value), in which the initial program voltage Vpgm is increased or decreased from the initial program voltage Vpgm. Other than this the trimming circuit is the same as the trimming circuit (trimming circuit of FIG. 7) relating to the above-described Embodiment one. That is, the trimming circuit relating to Embodiment three includes the Vpgm increment command register 101, the trimming shift register (TSR) 102, the increment count accumulation register (AR) 103, the accumulate value equation shift register (ASR) 104, the adder (ADDR) 105, the register data transfer command register 120 and WL0 to WLm offset value WL_Vpgm parameter registers (PR0 to PRm) 300, 301, 302, . . . , 30$m$.

Figure 12:
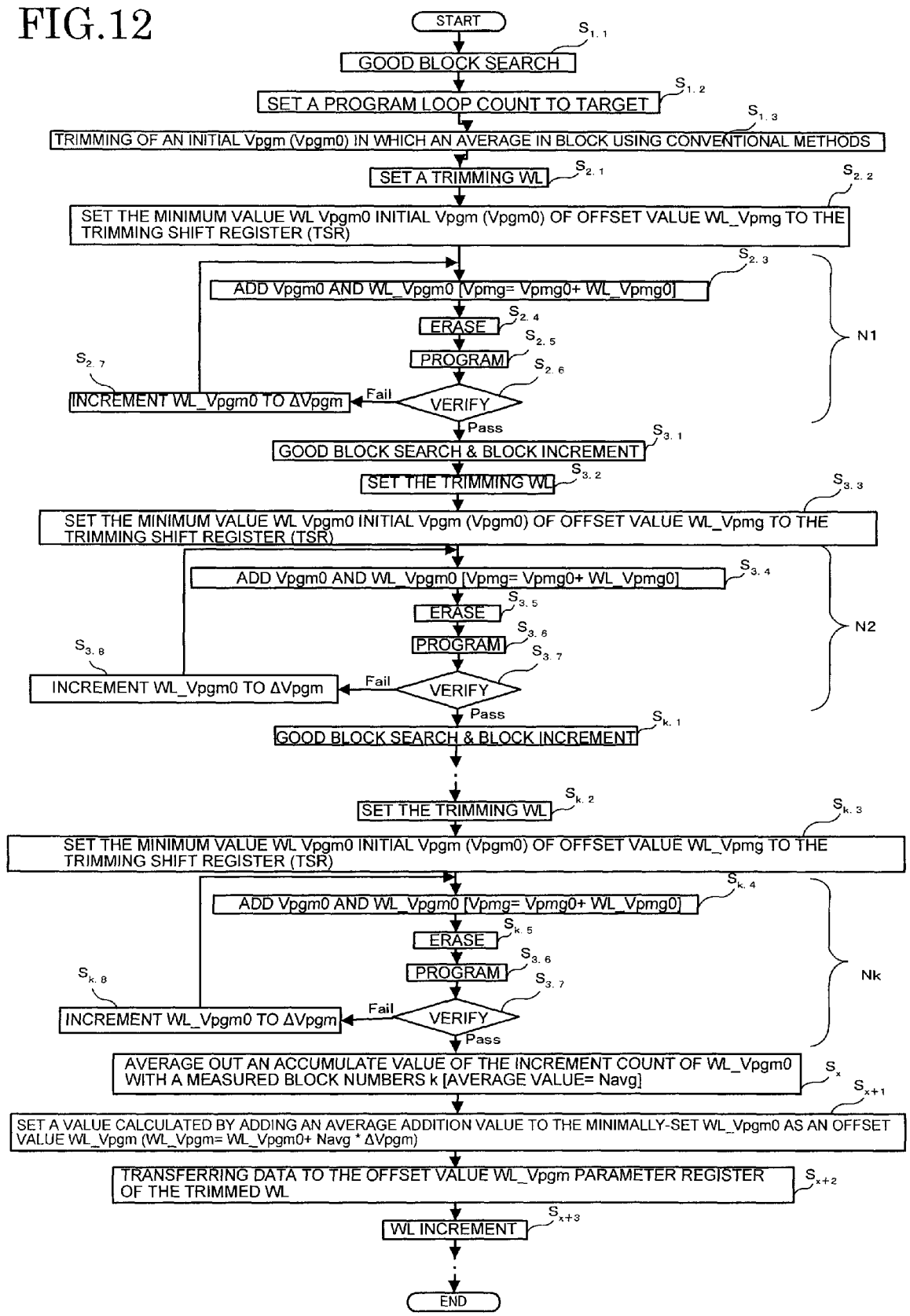
FIG. 12 is a flow chart of the adjustment (trimming) of the voltage shift value (offset value) from the initial Vpgm in the NAND type flash memory 1 according to Embodiment three of the nonvolatile semiconductor memory of the present invention.

FIG. 12 shows a flow chart for explaining an adjustment (trimming) which provides the parameters of a voltage shift value (offset value) to the initial Vpgm in the NAND type flash memory 1 according to Embodiment three. Step 1.1 ($S_{1.1}$) is the same as that of the above-described Embodiment one (the flow chart of FIG. 8), so the description will be omitted here.

Next in Step 1.2 ($S_{1.2}$), a parameter of the number of program loops to a memory cell (target) of the initial normal block using an external input device is set. In addition, the number of program loops can be arbitrarily set. The set value (set value) of the number of program loops is provided to and stored in the ROM fuse 11 (FIG. 2 and FIG. 3) by the external input device via the above-described control pin, the above-described input-output pin and the I/O control circuit 13.

Next, the trimming circuit performs an adjustment (trimming) of the initial Vpgm (Vpgm0) which was averaged in the block. This operation, for instance, may be conducted by a method shown in the flow chart in the above-described FIG. 14. However, in the method shown in the flow chart of the above-described FIG. 14, it was necessary to perform a calculation process using an external tester such as a CPU or a memory in order to prepare the initial program voltage Vpgm0 for each word line WL. In Embodiment three, the Vpgm0 is not prepared for each word line WL but is prepared as an averaged value of all the word lines WL in the block and therefore, it is not necessary to perform a calculation process using the external tester such as a CPU or a memory.

The subsequent sequence is basically the same as the above-described Embodiment one (the flow chart shown in FIG. 8). However in Embodiment three, a part of the sequence is changed in order to prepare a voltage shift value (offset value) WL_Vpgm from the initial program voltage Vpgm for each word line WL. In addition, the offset value WL_Vpgm is a value which has a numerical value range from a minus shift (minus value) to a plus shift (plus value) and is not specifically limited; for instance, the value is in a range of −8 to +8V. At first in Step 2.1 ($S_{2.1}$), the address of a word line WL to be trimmed is set.

Next in Step 2.2 ($S_{2.2}$), a minimum value WL_Vpgm0 of an offset value WL_Vpgm is set to the trimming shift register (TSR). The set value (set value) of this trimming shift register (TSR) 102 is provided to and stored in the ROM fuse 11 (FIG. 2 and FIG. 3) by an external input device via the above-described control pin, the above-described input-output pin and the I/O control circuit 13.

Next in Step 2.3 ($S_{2.3}$), the adder (ADDR) 105 adds the initial program voltage Vpgm0 to the minimum value WL_Vpgm0 (Vpgm=Vpgm0+WL_Vpgm0).

Because the processes from Step 2.4 ($S_{2.4}$) to Step 2.6 ($S_{2.6}$) are the same as in Step 1.4 ($S_{1.4}$) to the Step 1.6 ($S_{1.6}$) of the above-described Embodiment one (the flow chart of FIG. 8), a description will be omitted here.

In Step 2.7 ($S_{2.7}$), the trimming shift register (TSR) 102 increases (increments) the minimum value WL_Vpgm0 by ΔVpgm. This operation can be performed automatically by a command input. After this, the process returns to Step 2.3 ($S_{2.3}$), and the process from Step 2.3 ($S_{2.3}$) to Step 2.6 ($S_{2.6}$) is repeated until all verification readouts in Step 2.6 ($S_{2.6}$) are passed (Pass). At this time, the number of times (N1) which the minimum value WL_Vpgm0 is incremented, is stored in the increment count accumulation register (AR) 103 in the trimming circuit.

Next in Step 3.1 ($S_{3.1}$), the trimming circuit again performs the Good Block Search and increments the blocks until a normal block. Then, the process from Step 3.2 ($S_{3.2}$) to Step 3.8 ($S_{3.8}$) is performed the same as the process from Step 2.1 ($S_{2.1}$) to Step 2.7 ($S_{2.7}$). At this time, the number of times (N2) which the WL_Vpgm0 is incremented, is stored in the increment count accumulation register (AR) 103 in the trimming circuit.

Next, the same operation as in Step 3.1 ($S_{3.1}$) to Step 3.8 ($S_{3.8}$) is repeated until the same number of increment times as the number of blocks to be measured (k in the example) is reached.

Next in Step x ($S_x$), the accumulate value equation shift register (ASR) 104 accumulates the number of increment times of the minimum value WL_Vpgm0 stored in the increment count accumulation register (AR) 103. The accumulate value equation shift register (ASR) 104 averages the accumulated value (average value=Navg) by the number of blocks to be measured (k in the example).

Next in Step x+1 ($S_{x+1}$), the adder (ADDR) 105 generates a result which is calculated by adding an average addition value (Navg*ΔVpgm) to WL_Vpgm0 which is set to a minimum value and the result is also set to the trimming shift register (TSR) 102 as an offset value parameter of a new chip (WL_Vpgm=WL_Vpgm 0+Navg*ΔVpgm).

Next in Step x+2 ($S_{x+2}$), the register data transfer command register 120 transfers data of the WL_Vpgm parameter of a new chip to the WL_Vpgm parameter of registers 300, 301, 302, ..., 30m corresponding to the trimmed word line WL. This operation can be performed just by an input of the address corresponding to the WL_Vpgm parameter register and the transfer command.

Next in Step x+3 ($S_{x+3}$), the trimming circuit increments the word line WL. Here, incrementing a word line WL means changing the word line WL which is to be trimmed to the word line WL adjacent to the bit line BL side. After this, the trimming circuit repeats the same operation from Step 1.1 ($S_{1.1}$) to Step x+3 ($S_{x+3}$) until the same number of increment times as the number of word lines WL to be measured is reached (for instance, m).

The WL0 to WLm offset values WL_Vpgm, which are set to the WL0 to WLm offset value WL_Vpgm parameter registers (PR0 to PRm) 300, 301, 302, ..., 30m are stored in the ROM fuse 11 (FIG. 2 and FIG. 3) by the control circuit 17 (FIG. 2 and FIG. 3). Here, the Rom fuse 11 has a predetermined region in which a parameter of the WL0 to WLm offset value WL_Vpgm is stored. Then the control circuit 17 (FIG. 2 and FIG. 3) controls the operations of each part of the NAND type flash memory 1 and performs data program and readout to and from the memory cell array 24 based on the parameter of the offset value WL_Vpgm stored in the ROM fuse 11 and the data stored in the data register 22.

In addition, the WL0 to WLm offset values which WL_Vpgm are set to the WL0 to WLm offset value WL_Vpgm parameter register (PR0 to PRm) 300, 301, 302, ..., 30m, may be configured to be stored in the parameter storage section other than the ROM fuse 11. In this case, the control circuit 17 (FIG. 2 and FIG. 3) controls the operations of each section of the NAND type flash memory 1 and performs data program and readout to and from the memory cell array 24 based on the parameter of the offset value WL_Vpgm stored in the parameter storage section and the data stored in the data register 22.

By doing so, in the NAND type flash memory of Embodiment three, it is possible to prepare the parameter of the voltage shift value (offset value) from the initial Vpgm for each word line WL. Thus, it is not necessary to perform an operation process using an external tester such as a CPU or a memory and it is possible to shorten the test time.

Additionally in Embodiment three, a case was described which used the same circuit as the circuit of the above-described Embodiment one; however, the same circuit as the circuit in the above-described Embodiment two can also be used.

Embodiment Four

Next Embodiment four will be explained in detail while referring to the accompanying figure.

In Embodiment four, the voltage shift value (offset value) from the initial Vpgm is prepared for each even numbered page and each odd numbered page as a parameter. The configurations in Embodiment four other than this are the same as the nonvolatile semiconductor memory device and the nonvolatile memory system of the above-mentioned Embodiment three.

Figure 13:
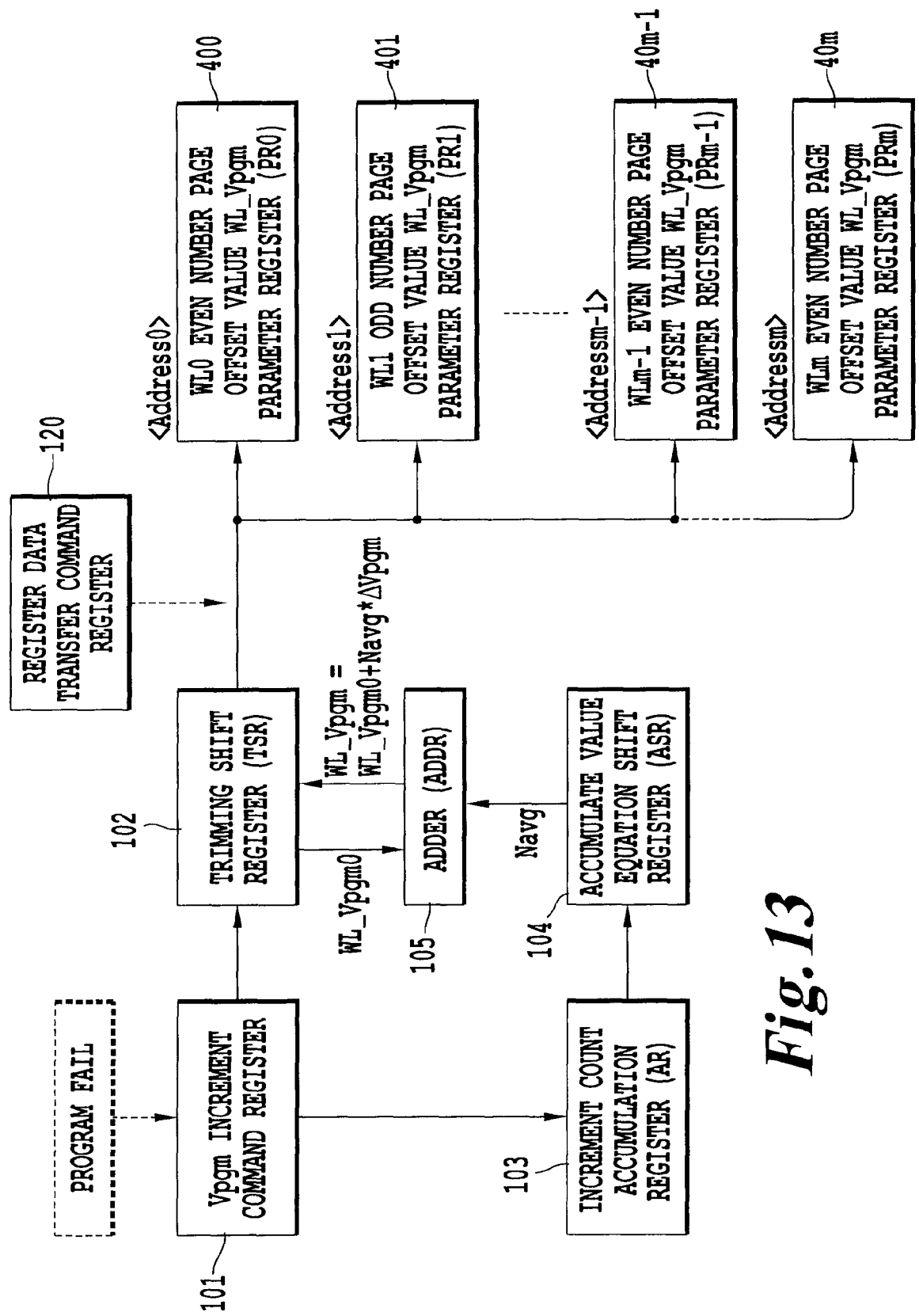
FIG. 13 is a block diagram showing a trimming circuit which provides the parameters of the voltage shift value (offset value) from the adjusted (trimmed) initial Vpgm to each even number page and each odd number page of the word line WL of the NAND type flash memory 1 according to Embodiment four of the nonvolatile semiconductor memory of the present invention.

FIG. 13 is a block diagram showing a trimming circuit which provides a parameter of the voltage shift value (offset value) adjusted (trimmed) to the initial Vpgm for each even numbered pages and each odd numbered page of the word line WL of the NAND type flash memory 1 relating to Embodiment four. The trimming circuit is comprised by a part of the control circuit 17. The trimming circuit is controlled by the control circuit 17. In addition, the trimming circuit may be comprised separately from the control circuit 17.

As shown in the figure, the trimming circuit of Embodiment four is the same as the trimming circuit (the circuit of FIG. 11) relating to the above-described Embodiment three, except that the parameter is used as a parameter of the voltage shift value (offset value) which is adjusted (trimmed) to the initial Vpgm for each even numbered page and each odd numbered of page of the word line WL. That is, the trimming circuit relating to Embodiment four, includes the Vpgm increment command register 101, the trimming shift register (TSR) 102, the increment count accumulation register (AR) 103, the accumulate value equation shift register (ASR) 104, the adder (ADDR) 105, the register data transfer command register 120 and the parameter registers (PR0 to PRm) 400, 401, ..., 40m of WL0 to WLm even numbered pages and odd numbered pages offset value WL_Vpgm.

An operation of the trimming circuit of Embodiment four is the same as that of the trimming circuit of Embodiment three except that instead of preparing a parameter of the voltage shift value (offset value), in which the trimming circuit of Embodiment three is adjusted (trimmed) to the initial Vpgm for each word line WL, the voltage shift value (offset value) which is adjusted (trimmed) to the initial Vpgm for each even numbered page and odd numbered pages of a word line WL is prepared as a parameter.

That is, the trimming circuit of Embodiment four obtains the offset value adjusted (trimmed) to the initial Vpgm for each even numbered page and each odd numbered page of the word line WL, the same process as in the flow chart shown in FIG. 12, and provides and stores it in parameter registers (PR0 to PRm) 400, 401, ..., 40m of the offset value WL_Vpgm of the WL0 to WLm even numbered page and odd numbered page.

The parameters of the WL0 to WLm even numbered page and odd numbered page offset values WL_Vpgm which are set to the offset value WL_Vpgm parameter registers (PR0 to PRm) 400, 401, ..., 40m of the WL0 to WLm even numbered page and odd numbered page are stored in the ROM fuse 11 (FIG. 2 and FIG. 3) by the control circuit 17 (FIG. 2 and FIG. 3). Here, the ROM fuse 11 has a predetermined region in which the parameters of the WL0 to WLm even numbered page and odd numbered page offset value WL_Vpgm are stored. Further, the control circuit 17 (FIG. 2 and FIG. 3) controls the operations of each part of the NAND type flash memory 1 and performs data program and readout to and from the memory cell array 24 based on the parameter of the offset value WL_Vpgm stored in the ROM fuse 11 and the data stored in the data register 22.

In addition, the trimming circuit relating to Embodiment four of the present invention may be configured by one register which shares the same register address as two of the parameter registers (PR0 to PRm) 400, 401, . . . , 40m of the offset value WL_Vpgm of an even numbered page and an odd numbered pages of each of the word lines WL0 to WLm, and may also be configured so that an offset value of an even numbered page and an odd numbered page of the respective word lines WL0 to WLm should be stored in a different region of this register. In the case where the configuration is set as an another embodiment of the present invention, as compared to the case in Embodiment four shown in FIG. 13, half of the register addresses are used and because a ROM address of the ROM fuse corresponding to half of the register addresses may be used, it is possible to reduce the register addresses and the ROM address by half. Also in this case, other embodiments of the present invention can be controlled by corresponding operations described above (addition of the average value, increment of register and so on).

In addition, Embodiment four of the present invention may be configured so that the parameters of the WL0 to WLm even numbered pages and odd numbered page offset values WL_Vpgm which are set to the WL0 to WLm even numbered page and odd numbered page offset value WL_Vpgm parameter registers (PR0 to PRm) 400, 401, . . . , 40m are provided to and stored in a parameter storage section other than the ROM fuse 11. In this case, the control circuit 17 (FIG. 2 and FIG. 3) controls the operations of each part of the NAND type flash memory 1 and performs data program and readout to and from the memory cell array 24 based on the parameter of the offset value WL_Vpgm stored in the parameter storage section and the data stored in the data register 22.

In the above-described Embodiments 1 to 4, the NAND type flash memory is described as an example of the nonvolatile semiconductor memory device of the present invention, however, the semiconductor memory device of the present invention may be a nonvolatile semiconductor memory device such as a NOR type, a DINOR type, an AND cell type EEPROM and so on.

In the nonvolatile semiconductor memory device relating to the above-described embodiments of the present invention, the above-described trimming circuit may provide a parameter of the initial program voltage which is optimized for each word line, and may provide a parameter which sets the voltage shift value from the initial program adjusted for each word line.

The nonvolatile semiconductor memory device relating to the above-described embodiment of the present invention does not limit the invention specifically, however, it is preferable that the nonvolatile semiconductor memory device is a NAND type flash memory device. However, as described above, the semiconductor memory device of the present invention may be a nonvolatile semiconductor memory such as the NOR type, the DINOR type, the AND cell type EEPROM and so on.

In addition, according to the present invention, a nonvolatile memory system including a nonvolatile semiconductor memory device and a memory device controller which controls the above-described nonvolatile semiconductor memory is proposed in which the nonvolatile semiconductor memory system is a nonvolatile semiconductor memory of the present invention.

In the nonvolatile semiconductor memory device relating to the embodiments of the present invention, it is preferred that the above-described memory cell store a plurality of bit data corresponding to the amount of electron injection. However, the present invention is not limited to this and the above-described memory cell may store one bit of data.

What is claimed is:

1. A nonvolatile semiconductor memory comprising:
a plurality of bit lines and word lines arranged to intersect each other, said plurality of word lines being divided into a plurality of word line groups, said plurality of word line groups including said plurality of word lines;
a memory cell array having a plurality of memory cell groups comprised of a plurality of electrically-programmable memory cells arranged in a region in which said bit lines and said word lines intersect;
a trimming circuit which obtains a parameter of an initial program voltage for each of said plurality of word line groups;
an initial Vpgm parameter register which receives said parameter of said initial program voltage for each of said plurality of word line groups from said trimming circuit and stores said parameter; and
a control circuit which programs data to each of said plurality of memory cell groups based on said parameter of said initial program voltage for each of said plurality of word line groups stored in said initial Vpgm parameter register, said trimming circuit being arranged in a part of said control circuit.

2. The nonvolatile semiconductor memory in claim 1, wherein said trimming circuit comprises:
a Vpgm increment command register which outputs an increment command which gradually increases said initial program voltage for each of said plurality of word line groups based on said parameter of said plurality of word line groups stored in said initial Vpgm parameter register; and
a trimming shift register which sets a trimming parameter for trimming said initial program voltage for each of said plurality of word line groups according to said increment command output from said Vpgm increment command register.

3. The nonvolatile semiconductor memory in claim 2, wherein said trimming circuit comprises:
an increment count accumulation register which accumulates an increment count of said initial program voltage for each of said plurality of word line groups according to said increment command output from said Vpgm increment command register;
an accumulate value equation shift register which averages said increment count accumulated by said increment count accumulation register for each of said plurality of word line groups; and
an adder which adds a value averaged by said accumulate value equation shift register to said initial program voltage;
and wherein said trimming shift register sets said trimming parameter for trimming said initial program voltage for each of said plurality of word line groups according to said increment command output from said Vpgm increment command register.

4. The nonvolatile semiconductor memory in claim 3, wherein said trimming circuit comprises:
a register data transfer command register which transfers said trimming parameter set by said trimming shift register to said initial Vpgm parameter register for each of said plurality of word line groups, and said initial Vpgm parameter register stores said trimming parameter for each of said plurality of word lines groups.

5. The nonvolatile semiconductor memory in claim 4, wherein:
said initial Vpgm parameter register is provided for each of said plurality of word line groups.

6. The nonvolatile semiconductor memory in claim 5, wherein:
said initial Vpgm parameter register of each of said plurality of word line groups is set with an address corresponding to each of said plurality of word line groups connected to said initial Vpgm parameter register;
said register data transfer command register transfers said trimming parameter of each of said plurality of word line groups to said initial Vpgm parameter register of each of said plurality of word line groups corresponding to said address; and
said initial Vpgm parameter register stores said trimming parameter of each of said plurality of word line groups.

7. The nonvolatile semiconductor memory in claim 2, wherein:
said initial Vpgm parameter register stores a voltage shift value as said trimming parameter, in which said initial program voltage is increased and decreased by said voltage shift value; and
said trimming shift register sets said trimming parameter for trimming said initial program voltage for each of said plurality of word line groups based on said voltage shift value stored in said initial Vpgm parameter register.

8. The nonvolatile semiconductor memory in claim 7, wherein:
said initial program voltage is an average value of said initial program voltage corresponding to each of said plurality of word line groups;
said Vpgm increment command register outputs a trimming command for trimming said initial program voltage for each of said plurality of word line groups based on said voltage shift value stored in said initial Vpgm parameter register; and
said trimming shift register sets said trimming parameter for trimming said initial voltage for each of said plurality of word line groups according to said trimming command output from said Vpgm command register.

9. The nonvolatile semiconductor memory in claim 7, wherein:
said initial Vpgm parameter register stores a minimum value of said voltage shift value; and
when said trimming shift register trims said initial programming voltage for each of said plurality of word line groups, said trimming shift register sets said trimming parameter by adding said minimum value to said initial program voltage based on said minimum value of said voltage shift value stored in said initial Vpgm parameter register.

10. The nonvolatile semiconductor memory in claim 7, wherein said trimming circuit comprises:
an increment count accumulation register which accumulates a trimming count of a voltage shift value according to said trimming command which is output from said Vpgm increment command register;
an accumulate value equation shift register which averages said trimming count accumulated by said increment count accumulation register;
an adder which adds a value averaged by said accumulate value equation shift register to said voltage shift value; and
wherein said trimming register sets said trimming parameter for trimming said initial programming voltage for each of said plurality of word line groups based on said voltage shift value and an addition value added by said adder.

11. The nonvolatile semiconductor memory in claim 7, wherein said trimming circuit comprises:
a register data transfer command register which transfers said trimming parameter set by said trimming shift register to said initial Vpgm parameter register and stores said trimming parameter for each of said plurality of word line groups in said initial Vpgm parameter register.

12. The nonvolatile semiconductor memory in claim 11, wherein:
said initial parameter register is provided for each of said plurality of word line groups.

13. The nonvolatile semiconductor memory as claimed in claim 12, wherein:
said initial Vpgm parameter register is set with an address for each of said plurality of word line groups connected to said initial Vpgm parameter register;
said register data transfer command register transfers said trimming parameter to said initial Vpgm parameter register corresponding to said address; and
said initial Vpgm parameter register stores said trimming parameter.

14. The nonvolatile semiconductor memory in claim 1, wherein:
said plurality of word lines are divided into groups corresponding to an arrangement region of said plurality of electrically-programmable memory cells within said memory cell array.

* * * * *